(12) United States Patent
Balakrishnan

(10) Patent No.: US 9,711,225 B2
(45) Date of Patent: Jul. 18, 2017

(54) REGROUPING AND SKIPPING CYCLES IN NON-VOLATILE MEMORY

(71) Applicant: SanDisk 3D LLC, Milpitas, CA (US)

(72) Inventor: Gopinath Balakrishnan, Santa Clara, CA (US)

(73) Assignee: SanDisk Technologies LLC, Plano, TX (US)

( * ) Notice: Subject to any disclaimer, the term of this patent is extended or adjusted under 35 U.S.C. 154(b) by 184 days.

(21) Appl. No.: 14/515,387

(22) Filed: Oct. 15, 2014

(65) Prior Publication Data

US 2015/0106554 A1   Apr. 16, 2015

Related U.S. Application Data

(60) Provisional application No. 61/891,771, filed on Oct. 16, 2013.

(51) Int. Cl.
G11C 7/00 (2006.01)
G11C 16/10 (2006.01)
(Continued)

(52) U.S. Cl.
CPC ........ G11C 16/107 (2013.01); G06F 12/0246 (2013.01); G11C 7/1006 (2013.01);
(Continued)

(58) Field of Classification Search
None
See application file for complete search history.

(56) References Cited

U.S. PATENT DOCUMENTS 4,926,312 A   5/1990   Nukiyama
5,890,192 A   3/1999   Lee
(Continued)

FOREIGN PATENT DOCUMENTS

EP      1282134        2/2003
WO   WO2006/130438    12/2006
(Continued)

OTHER PUBLICATIONS

U.S. Appl. No. 14/619,985, filed Feb. 11, 2015.
(Continued)

*Primary Examiner* — Ryan Bertram
*Assistant Examiner* — Tracy Chan
(74) *Attorney, Agent, or Firm* — Vierra Magen Marcus LLP

(57) ABSTRACT

A non-volatile memory system utilizes multiple programming cycles to write units of data, such as a logical page of data, to a non-volatile memory array. User data is evaluated before writing to determine whether programming can be skipped for bay addresses. The system determines whether programming can be skipped for an initial set of bay groups. If a bay group cannot be skipped, the system determines whether the bay group includes individual bays that may be skipped. Bays are regrouped into new bay groups to reduce the number of BAD cycles during programming. Independent column addressing for multiple bays within a bay group is provided. During a column address cycle, a separate column address is provided to the bays to select different columns for programming within each bay. By simultaneously programming multiple column addresses during a single column address cycle, the system may skip programming for some column address cycles.

18 Claims, 21 Drawing Sheets

(51) Int. Cl.
*G06F 12/02* (2006.01)
*G11C 7/10* (2006.01)
*G11C 13/00* (2006.01)

(52) U.S. Cl.
CPC .. *G11C 13/0069* (2013.01); *G06F 2212/7208* (2013.01); *G11C 2013/0076* (2013.01); *G11C 2013/0088* (2013.01); *G11C 2213/71* (2013.01)

(56) References Cited

U.S. PATENT DOCUMENTS

| | | |
|---|---|---|
| 6,029,226 A | 2/2000 | Ellis |
| 6,201,738 B1 | 3/2001 | Hebishima |
| 6,735,104 B2 | 5/2004 | Scheuerlein |
| 7,111,140 B2 | 9/2006 | Estakhri |
| 7,142,471 B2 | 11/2006 | Fasoli |
| 7,219,271 B2 | 5/2007 | Kleveland et al. |
| 7,243,203 B2 | 7/2007 | Scheuerlein |
| 7,383,476 B2 | 6/2008 | Crowley |
| 7,424,593 B2 | 9/2008 | Estakhri |
| 7,490,283 B2 | 2/2009 | Gorobets |
| 7,499,366 B2 | 3/2009 | Scheuerlein |
| 7,502,260 B2 | 3/2009 | Li |
| 7,545,689 B2 | 6/2009 | Ilkbahar et al. |
| 7,685,376 B2 | 3/2010 | Zimmer et al. |
| 7,804,724 B2 | 9/2010 | Way |
| 7,966,532 B2 | 6/2011 | Bottelli et al. |
| 8,004,926 B2 | 8/2011 | Sutardja et al. |
| 8,213,243 B2 | 7/2012 | Balakrishnan et al. |
| 8,223,525 B2 | 7/2012 | Balakrishnan et al. |
| 8,374,051 B2 | 2/2013 | Yan et al. |
| 8,397,024 B2 | 3/2013 | Fasoli et al. |
| 8,947,944 B2 | 2/2015 | Balakrishnan et al. |
| 8,947,972 B2 | 2/2015 | Balakrishnan et al. |
| 2001/0005876 A1 | 6/2001 | Srinivasan |
| 2001/0017798 A1 | 8/2001 | Ishii |
| 2002/0041527 A1 | 4/2002 | Tanaka |
| 2002/0136045 A1 | 9/2002 | Scheuerlein |
| 2004/0188714 A1 | 9/2004 | Scheuerlein |
| 2004/0190360 A1 | 9/2004 | Scheuerlein |
| 2004/0250183 A1 | 12/2004 | Crowley |
| 2004/0255088 A1 | 12/2004 | Scheuerlein |
| 2006/0077720 A1 | 4/2006 | Im |
| 2006/0146639 A1 | 7/2006 | Fasoli |
| 2007/0147133 A1 | 6/2007 | Im |
| 2008/0151637 A1 | 6/2008 | Doyle |
| 2009/0161474 A1 | 6/2009 | Scheuerlein |
| 2009/0244987 A1 | 10/2009 | Cernea |
| 2010/0046267 A1 | 2/2010 | Yan |
| 2010/0146189 A1* | 6/2010 | Otterstedt .............. G11C 16/10 711/103 |
| 2010/0265750 A1 | 10/2010 | Yan |
| 2011/0047330 A1 | 2/2011 | Potapov et al. |
| 2011/0141788 A1 | 6/2011 | Balakrishnan et al. |
| 2012/0002457 A1* | 1/2012 | Kanda ................. G11C 7/1021 365/148 |
| 2012/0236663 A1* | 9/2012 | Balakrishnan ........... G11C 5/02 365/189.16 |
| 2012/0275210 A1 | 11/2012 | Yan et al. |

FOREIGN PATENT DOCUMENTS

| | | |
|---|---|---|
| WO | WO2010/107099 A1 | 9/2010 |
| WO | WO2012/118618 A1 | 9/2012 |
| WO | WO2012/129083 A1 | 9/2012 |

OTHER PUBLICATIONS

Notice of Allowance dated Aug. 31, 2016, U.S. Appl. No. 14/619,985, filed Feb. 22, 2015.
International Search Report & The Written Opinion of the International Searching Authority dated Jan. 23, 2015, International Application No. PCT/US2014/060907.
U.S. Appl. No. 15/392,852, filed Dec. 28, 2016 by Balakrishnan et al.

\* cited by examiner

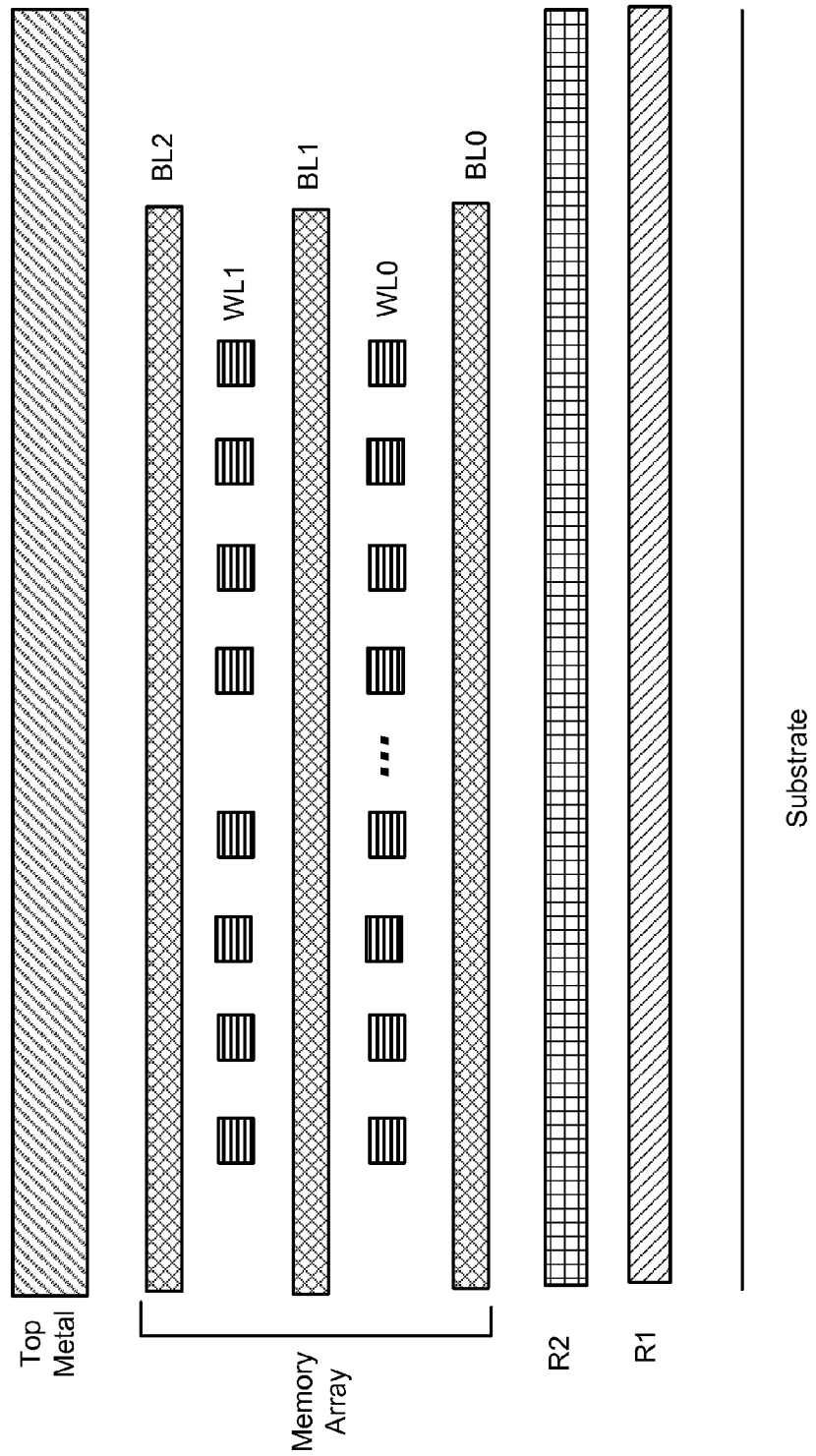

| Bay Group 0 | Bay Group 1 | Bay Group 2 | Bay Group 3 |
|---|---|---|---|
| Bay 0 | Bay 4 | Bay 8 | Bay 12 |
| Bay 1 | Bay 5 | Bay 9 | Bay 13 |
| Bay 2 | Bay 6 | Bay 10 | Bay 14 |
| Bay 3 | Bay 7 | Bay 11 | Bay 15 |

*Fig. 14*

| Bay Group 0 | Bay Group 1 | Bay Group 2 | Bay Group 3 |
|---|---|---|---|
| Bay 0 Unskip | Bay 4 Skip | Bay 8 Skip | Bay 12 Unskip |
| Bay 1 Skip | Bay 5 Unskip | Bay 9 Skip | Bay 13 Skip |
| Bay 2 Skip | Bay 6 Skip | Bay 10 Skip | Bay 14 Unskip |
| Bay 3 Skip | Bay 7 Skip | Bay 11 Skip | Bay 15 Skip |

*Fig. 15*

|  | CAD0 | CAD1 | CAD2 | CAD3 |
|---|---|---|---|---|
| Bay 0 | Unskip | Skip | Skip | Unskip |
| Bay 1 | Skip | Unskip | Skip | Skip |
| Bay 2 | Skip | Skip | Skip | Unskip |
| Bay 3 | Skip | Skip | Skip | Skip |

*Fig. 16*

| ReGroup #1 | ReGroup #2 | Default Bay Group #3 | ReGroup #4 |
|---|---|---|---|
| Bay 0 Unskip | Bay 4 Skip | Bay 8 Skip | Bay 2 Skip |
| Bay 5 Unskip | Bay 1 Skip | Bay 9 Skip | Bay 13 Skip |
| Bay 12 Unskip | Bay 6 Skip | Bay 10 Skip | Bay 3 Skip |
| Bay 14 Unskip | Bay 7 Skip | Bay 11 Skip | Bay 15 Skip |

*Fig. 17*

| BAD Group Cycle | Cycle 0 | Cycle 1 | Cycle 2 | Cycle 3 | No. of Cycles | Comments |
|---|---|---|---|---|---|---|
| No Skipping | Group 0 | Group 1 | Group 2 | Group 3 | 4 Cycles | No Skipping |
| Skipping and No Grouping | Group 0 | Group 1 | Group 3 | Skip | 3 Cycles | Skip Group 2 |
| Skipping and ReGrouping | ReGroup 0 | Skip | Skip | Skip | 1 Cycle | Regroup Bays 0, 6, 13, 15; Skip Groups 1, 2, 3 |

*Fig. 18*

| CAD Cycle | | Cycle 0 | Cycle 1 | Cycle 1 | Cycle 3 | Total Cycles | Comments |
|---|---|---|---|---|---|---|---|
| No Skipping | | CAD 0 | CAD 1 | CAD 2 | CAD 3 | 4 Cycles | No Skipping |
| Skipping (w/ Common CAD) | | CAD 0 | CAD 1 | CAD 3 | Skip | 3 Cycles | Skip CAD #3 #3 |
| Individual CAD | BAY0 | CAD0 | CAD 3 | Skip | Skip | 2 Cycles | Skip CAD #2, #3 |
| | BAY1 | CAD1 | Skip | Skip | Skip | | Skip CAD #1, #3, #4 |
| | BAY2 | CAD3 | Skip | Skip | Skip | | Skip CAD #1, #2, #3 |
| | BAY3 | Skip | Skip | Skip | Skip | | Skip All |

*Fig. 19*

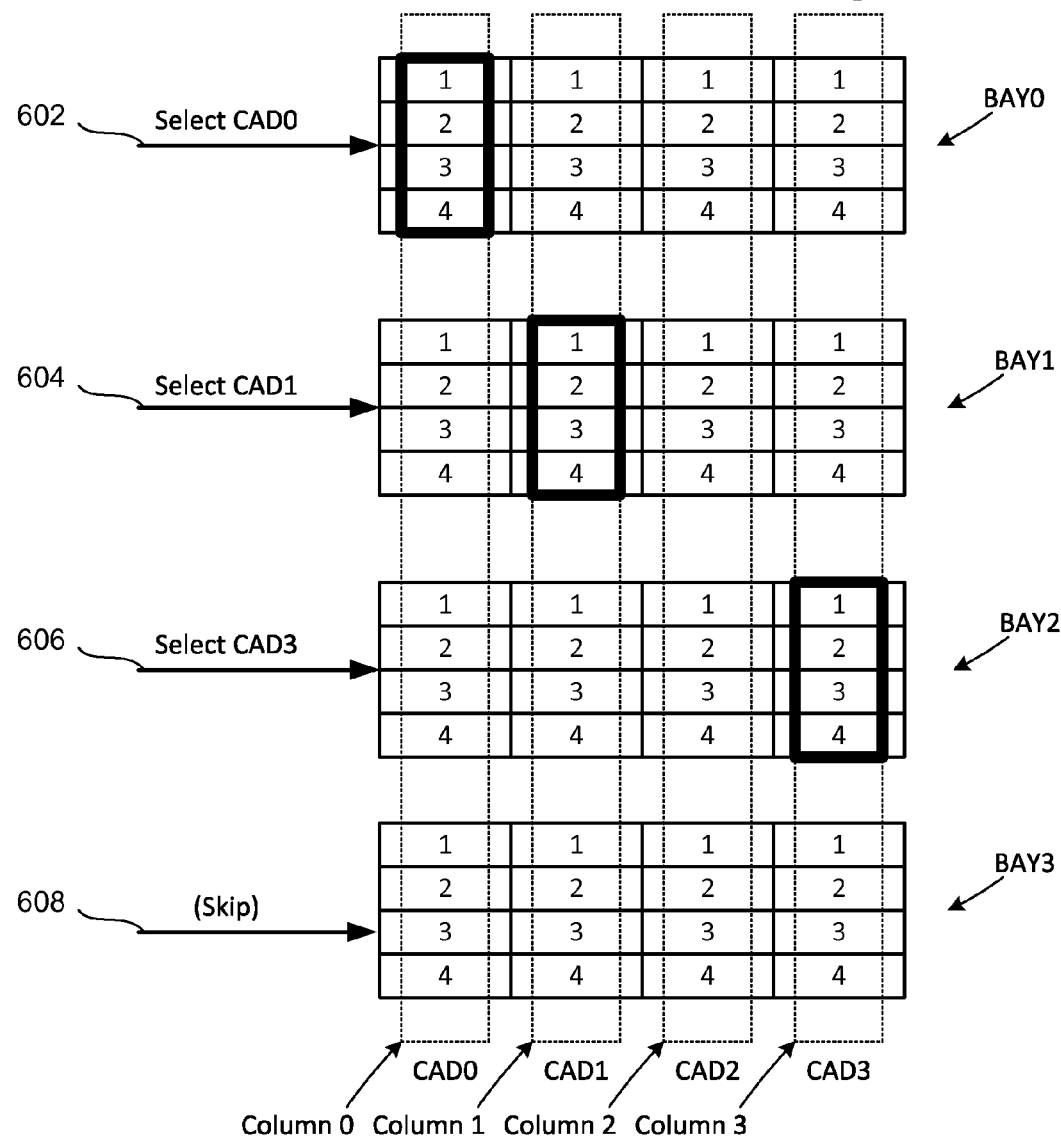

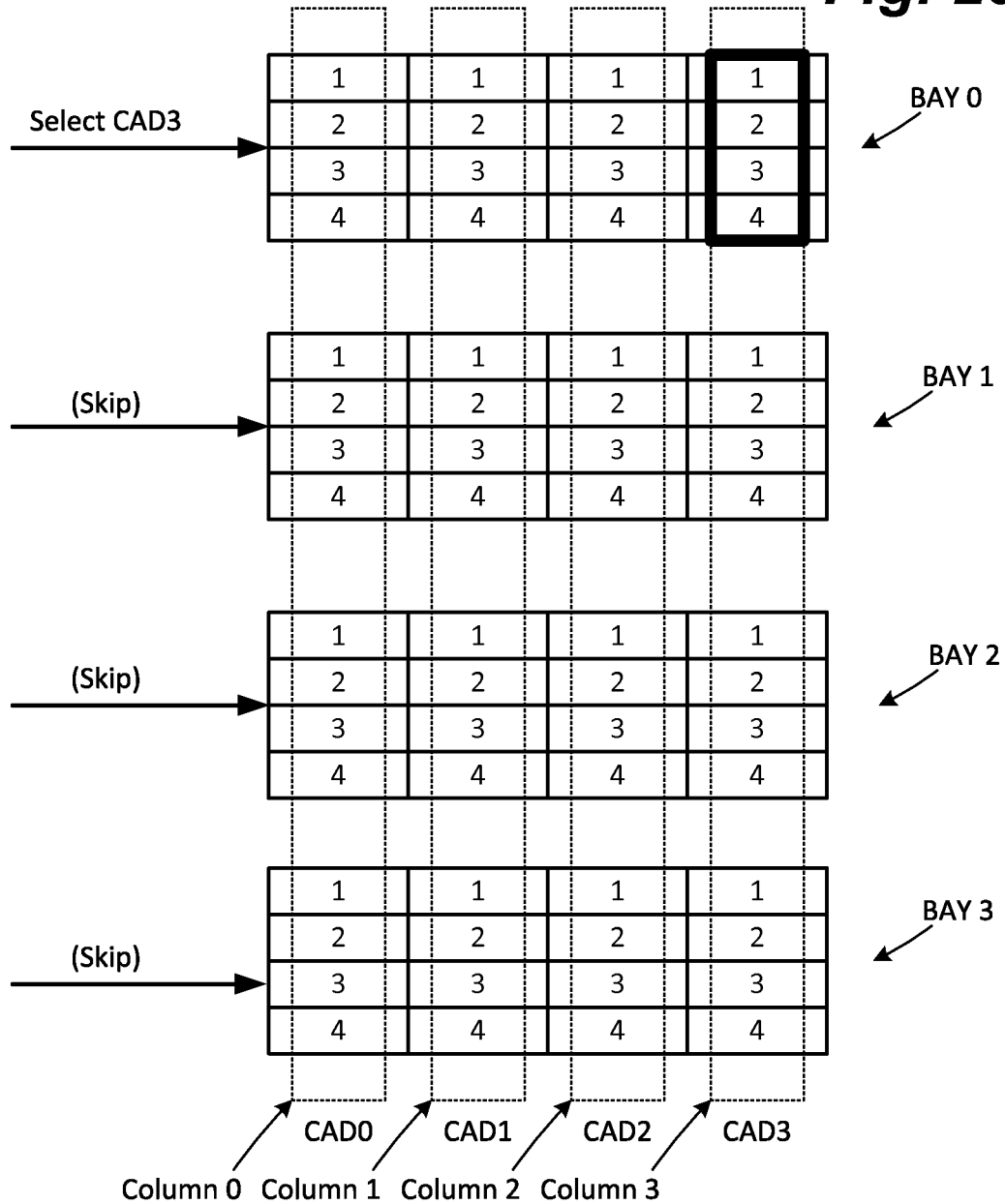

REGROUPING AND SKIPPING CYCLES IN NON-VOLATILE MEMORY

CLAIM OF PRIORITY

The present application claims priority from U.S. Provisional Patent Application No. 61/891,771, entitled "Regrouping and Skipping Cycles in Non-Volatile Memory," by Balakrishnan, filed Oct. 16, 2013, incorporated by reference herein in its entirety.

BACKGROUND OF THE INVENTION

The present disclosure relates to technology for non-volatile storage.

Semiconductor memory has become more popular for use in various electronic devices. For example, non-volatile semiconductor memory is used in cellular telephones, digital cameras, personal digital assistants, mobile computing devices, non-mobile computing devices and other devices. When semiconductor memory is used in consumer electronic devices, it is desirable to minimize the amount of power used by the semiconductor memory in order to conserve the battery of the host electronic device. Additionally, consumers generally want the semiconductor memory to perform at sufficient speeds so that the memory does not slow down operation of the host electronic device.

BRIEF DESCRIPTION OF THE DRAWINGS

FIG. 5B depicts a subset of the layers of one embodiment of a three-dimensional memory.

FIG. 14 is a table describing an example of the divisions of bays into bay groups.

FIG. 15 is a table describing an example of the skip evaluation for a plurality of bay groups.

FIG. 16 is a table describing an example of a skip evaluation for a plurality of columns across a bay group.

FIG. 17 is a table describing a skip evaluation and regrouping of bays for according to one embodiment.

FIG. 18 is a table comparing a skip evaluation and regrouping according to one embodiment with techniques for no skipping and skipping without regrouping.

FIG. 19 is a table comparing the use of individual column addressing for column skipping with techniques for no skipping and skipping with the use of a common column address for all bays.

FIGS. 20A-20B are block diagrams depicting the selection of individual column addresses for different bays of a bay group during a plurality of column address cycles.

DETAILED DESCRIPTION

Figure 1:
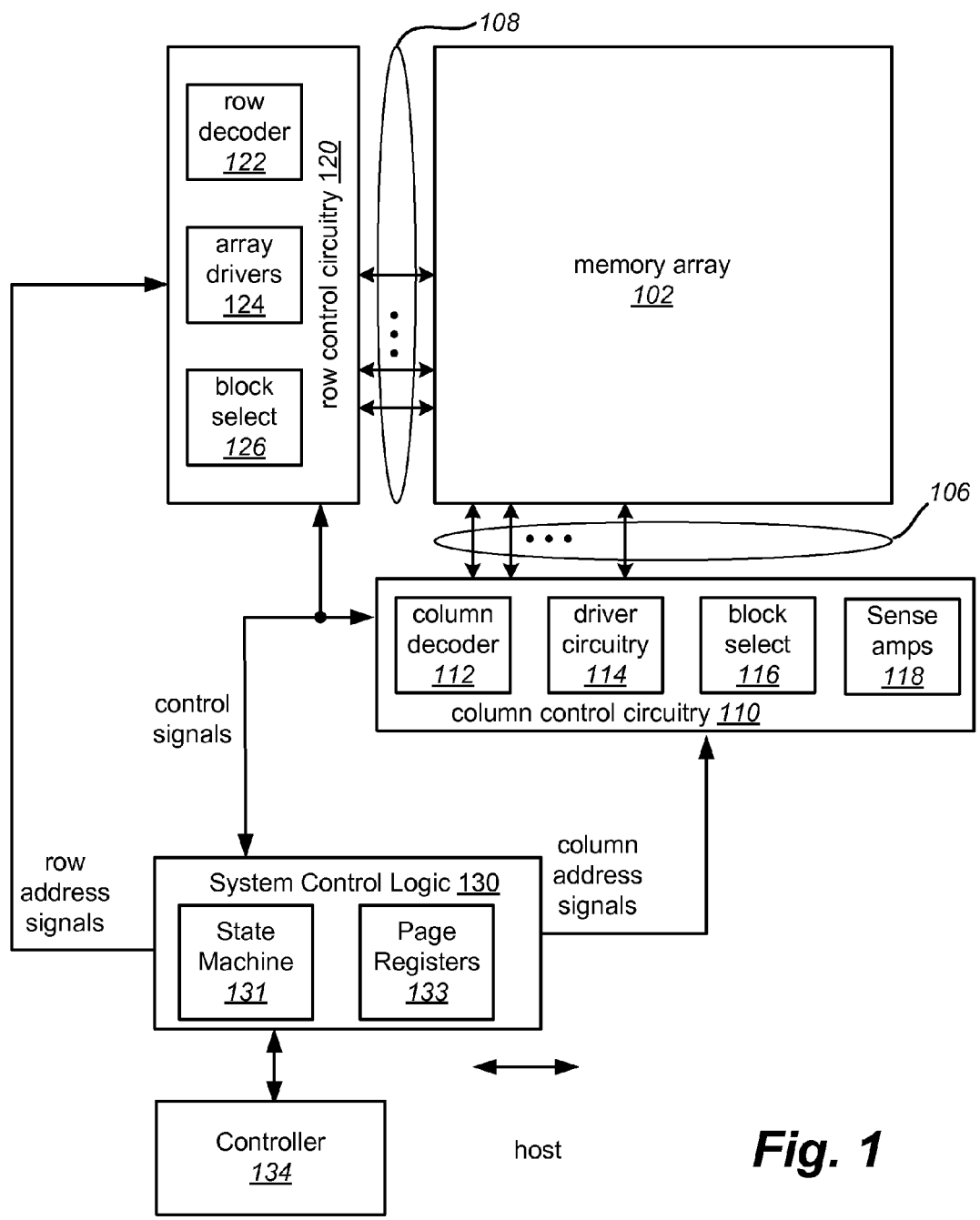
FIG. 1 is a block diagram of one embodiment of a non-volatile memory system.

The disclosed technology is directed to non-volatile memory that utilizes multiple programming cycles to write units of data, such as a logical page of data, to a non-volatile memory array. Many non-volatile memory arrays utilize bays that contain a plurality of blocks of memory cells within a memory array. Each bay may contain a set of sense amplifiers that are shared by all of the blocks within the bay. The bays may be combined into groups that are selected for programming using a common bay address (BAD) to select a BAD group for a BAD cycle. The memory cells may also be divided into columns that span multiple bays. Each bay includes a subset of memory cells from each of the columns. Within a BAD cycle, multiple column address (CAD) cycles are used. A CAD is used to select a column of memory cells for programming during a CAD cycle.

A non-volatile memory system in one embodiment evaluates user data before writing to determine whether programming can be skipped for bay addresses corresponding to a write operation. The system compares the user data for a write request with memory data read from the array to determine if programming can be skipped for particular bits or memory cells corresponding to the write operation. The skip analysis can be performed before an initial write operation and/or before retry requests after unsuccessful programming iterations. As part of a bay address skip analysis, the system may first determine whether programming can be skipped for an initial set of bay groups. If a bay group cannot be skipped, the system determines whether the bay group includes any individual bays that may be skipped. The system then regroups the individual bays to be programmed into new bay groups that minimize the number of BAD cycles used during programming.

A non-volatile memory in one embodiment utilizes independent column addressing for multiple bays within a bay group. Independent column addressing permits the system to provide separate column addresses to individual bays within a bay group during a column address cycle. The system can first determine whether programming can be skipped for a particular column address including a column of memory cells across a bay group. If a column address cannot be skipped, the system determines whether the subsets of memory cells of the column at each bay can be skipped. The system can then combine subsets of memory cells from different columns for programming during a common column address cycle. During the column address cycle, the system provides a separate column address to the bays to select different columns for programming within each bay. By simultaneously programming multiple column addresses during a single column address cycle, the system may be able to skip programming for some column address cycles. Thus, the system can skip an entire column address when all bits for the column have passed verification and can skip programming for subsets of columns when all of the bits for a column at a particular bay have passed verification.

FIG. 1 is a block diagram that depicts one example of a memory system 100 that can be used to implement embodiments of the disclosed technology. Memory system 100 includes a memory array 102, which can be a two or three-dimensional array of memory cells. In one embodiment, memory array 102 is a monolithic three dimensional memory array. The array terminal lines of memory array 102 include the various layer(s) of word lines organized as rows, and the various layer(s) of bit lines organized as columns. However, other orientations can also be implemented.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three Dimensional Structure Memory." The substrates may be thinned or removed from the memory levels before bonding, but as the memory levels are initially formed over separate substrates, such memories are not true monolithic three dimensional memory arrays.

Memory system 100 includes row control circuitry 120, whose outputs 108 are connected to respective word lines of the memory array 102. For purposes of this document, a connection can be a direct connection or indirect connection (e.g., via one or more other components). Row control circuitry 120 receives a group of row address signals and one or more various control signals from System Control Logic circuit 130, and typically may include such circuits as row decoders 122, array drivers 124, and block select circuitry 126 for both read and programming operations.

Memory system 100 also includes column control circuitry 110 whose input/outputs 106 are connected to respective bit lines of the memory array 102. Column control circuitry 110 receives a group of column address signals and one or more various control signals from System Control Logic 130, and typically may include such circuits as column decoders 112, driver circuitry 114, block select circuitry 116, and sense amplifiers 118. In one embodiment, sense amplifiers 118 provide signals to the bit lines and sense signals on the bit lines. Various sense amplifiers known in the art can be used.

System control logic 130 receives data and commands from controller 134 and provides output data to controller 134. Controller 134 communicates with a host. System control logic 130 may include one or more state machines 131, page registers 133 and other control logic for controlling the operation of memory system 100. In other embodiments, system control logic 130 receives data and commands directly from a host and provides output data to that host, because system control logic 130 includes the functionality of a controller.

In one embodiment, system control logic 130, column control circuitry 110, row control circuitry 120 and memory array 102 are formed on the same integrated circuit. For example, system control logic 130, column control circuitry 110 and row control circuitry 120 can be formed on the surface of a substrate and memory array 102 is a monolithic three-dimensional memory array formed above the substrate (and, therefore, above all or a portion of system control logic 130, column control circuitry 110 and row control circuitry 120). In some cases, a portion of the control circuitry can be formed on the same layers as some of the memory array. Controller 134 can be on the same substrate as or a different substrate than the other components depicted in FIG. 1. Controller 134, system control logic 130, column control circuitry 110, column decoder 112, driver circuitry 114, block select 116, sense amplifiers 118, row control circuitry 120, row decoder 122, array drivers 124 and/or block select 126, alone or in any combination, can be considered control circuitry or one or more control circuits.

Memory array 102 includes a plurality of memory cells. In one embodiment, each memory cell includes a steering element (e.g., a diode) and a resistance element. In one example implementation, the memory cells may be such that they can be programmed once and read many times. One example memory cell includes a pillar of layers formed at the intersection between the upper and lower conductors. In one embodiment, the pillar includes a steering element, such as a diode, that is connected in series with a state change element, such as an antifuse layer. When the antifuse layer is intact, the cell is electrically an open circuit. When the antifuse layer is breached, the cell is electrically a diode in series with the resistance of the breached antifuse layer.

In another embodiment, memory cells are re-writable. For example, a rewriteable non-volatile memory cell can include a diode or other select device coupled in series or another fashion with a reversible resistance-switching element. A reversible resistance-switching element includes reversible resistance-switching material having a resistance that may be reversibly switched between two or more states. For example, the reversible resistance-switching material may be in an initial high-resistance state upon fabrication that is switchable to a low-resistance state upon application of a first voltage and/or current. Application of a second voltage and/or current may return the reversible resistance-switching material to the high-resistance state. Alternatively, the reversible resistance-switching element may be in an initial low-resistance state upon fabrication that is reversibly switchable to a high-resistance state upon application of the appropriate voltage(s) and/or current(s). One resistance state may represent a binary "0" while another resistance state may represent a binary "1." More than two data/resistance states may be used so that the memory cell stores two or more bits of data. In one embodiment, the process of switching the resistance from the high-resistance state to the low-resistance state is referred to as a SET operation. The process of switching the resistance from the low-resistance state to the high-resistance state is referred to as a RESET operation. The high-resistance state is associated with binary data "0" and the low-resistance state is associated with binary data "1." In other embodiments, SET and RESET and/or the data encoding can be reversed. In some embodiments, the first time a resistance-switching element is SET requires a higher than normal voltage and is referred to as a FORMING operation.

Figure 2:
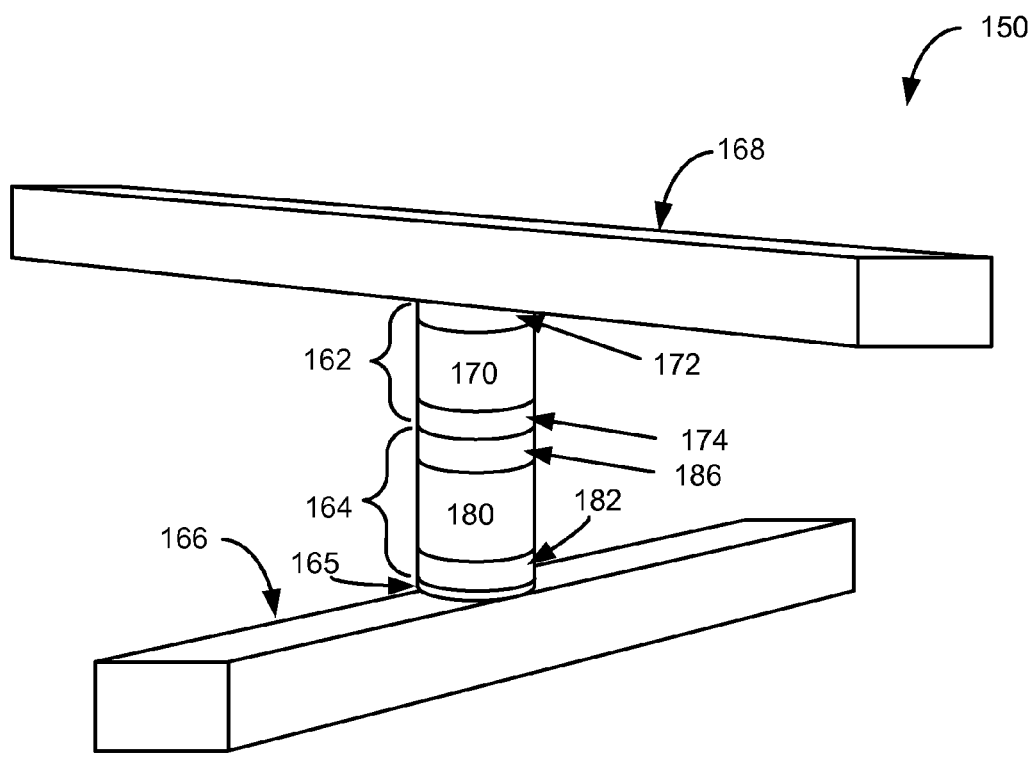
FIG. 2 is a simplified perspective view of one embodiment of a memory cell.

FIG. 2 is a simplified perspective view of one example of a memory cell 150 that includes reversible resistance-switching element 162, steering element 164 and barrier 165 coupled in series and positioned between a first conductor 166 and a second conductor 168. Reversible resistance-switching element 162 includes reversible resistance-switching material 170 having a resistance that may be reversibly switched between two or more states. In some embodiments, reversible resistance-switching material 170 may be formed from a metal oxide.

Various different metal oxides can be used. In one example, nickel oxide is used. In one embodiment, the reversible resistance-switching material 170 includes at least a portion of a nickel oxide layer formed by selectively depositing nickel and then oxidizing the nickel layer. In other embodiments, nickel oxide itself may be selectively deposited. In other embodiments Hafnium oxide may be deposited by an atomic layer deposition process using a precursor containing Hafnium. Other materials may be selectively deposited, and then annealed and/or oxidized if necessary, to form reversible resistance-switching materials for use in memory cells. For example, a layer of Nb, Ta, V, Al, Ti, Co, cobalt-nickel alloy, etc., may be selectively deposited, such as by electroplating, and oxidized to form a reversible resistance-switching material.

Another variable resistance material is amorphous silicon doped with V, Co, Ni, Pd, Fe or Mn, for example as described in Rose et al., U.S. Pat. No. 5,541,869. Another class of material is taught by Ignatiev et al. in U.S. Pat. No. 6,473,332: these are perovskite materials such as $Pr_1-XCa_xMnO_3$ (PCMO), $La_1-XCa_xMnO_3$ (LCMO), $LaSrMnO_3$ (LSMO), or $GdBaCo_xO_Y$ (GBCO). Another option for this variable-resistance material is a carbon-polymer film comprising carbon black particulates or graphite, for example, mixed into a plastic polymer, as taught by Jacobson et al. in U.S. Pat. No. 6,072,716. Another example is to use carbon nanotubes as a reversible resistance-switching materials.

Another material is taught by Campbell et al. in U.S. Patent Application 2003/0045054, and by Campbell in U.S. Patent Application 2003/0047765. This material is doped chalcogenide glass of the formula $A_xB_y$, where A includes at least one element from Group IIIA (B, Al, Ga, In, Ti), Group IVA (C, Si, Ge, Sn, Pb), Group VA (N, P, As, Sb, Bi), or Group VIIA (F, Cl, Br, I, At) of the periodic table, where B is selected from among S, Se and Te and mixtures thereof. The dopant is selected from among the noble metals and transition metals, including Ag, Au, Pt, Cu, Cd, Ir, Ru, Co, Cr, Mn or Ni.

Reversible resistance-switching element 162 includes electrodes 172 and 174. Electrode 172 is positioned between reversible resistance-switching material 170 and conductor 168. In one embodiment, electrode 172 is made of platinum. Electrode 174 is positioned between reversible resistance-switching material 170 and steering element 164. In one embodiment, electrode 174 is made of Titanium Nitride, and serves as a barrier layer. In another embodiment electrode 174 is n+ doped polysilicon, resistance switching material 170 is Hafnium Oxide and electrode 172 is Titanium Nitride.

Steering element 164 can be a diode, or other suitable steering element that exhibits non-ohmic conduction by selectively limiting the voltage across and/or the current flow through the reversible resistance-switching element 162. In this manner, the memory cell 150 may be used as part of a two or three dimensional memory array and data may be written to and/or read from the memory cell 150 without affecting the state of other memory cells in the array.

Steering element 164 may include any suitable diode such as a vertical polycrystalline p-n or p-i-n diode, whether upward pointing with an n-region above a p-region of the diode or downward pointing with a p-region above an n-region of the diode.

In some embodiments, steering element 164 may be a diode formed from a polycrystalline semiconductor material such as polysilicon, a polycrystalline silicon-germanium alloy, polygermanium or any other suitable material. For example, the steering element 164 can be a diode that includes a heavily doped n+ polysilicon region 182, a lightly doped or an intrinsic (unintentionally doped) polysilicon region 180 above the n+ polysilicon region 182, and a heavily doped p+ polysilicon region 186 above the intrinsic region 180. In some embodiments, a thin (e.g., a few hundred angstroms or less) germanium and/or silicon-germanium alloy layer (not shown), with about 10% or more of germanium when using a silicon-germanium alloy layer, may be formed on the n+ polysilicon region 182 to prevent and/or reduce dopant migration from the n+ polysilicon region 182 into the intrinsic region 180. It will be understood that the locations of the n+ and p+ regions may be reversed. When steering element 164 is fabricated from deposited silicon (e.g., amorphous or polycrystalline), one embodiment may include a silicide layer being formed on the diode to place the deposited silicon in a low resistance state.

Conductors 166 and 168 include any suitable conductive material such as tungsten, any appropriate metal, heavily doped semiconductor material, a conductive silicide, a conductive silicide-germanide, a conductive germanide, or the like. In the embodiment of FIG. 2, conductors 166 and 168 are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with conductors 166 and 168 to improve device performance and/or aid in device fabrication. In one embodiment, conductors 166 and 168 can be bit lines or word lines.

Although the reversible resistance-switching element 162 is shown as being positioned above the steering element 164 in FIG. 2, it will be understood that in alternative embodiments, the reversible resistance-switching element 162 may be positioned below the steering element 164. While FIG. 2 shows one example of a memory cell, no one particular type or structure of a memory cell is required for the technology disclosed herein. Many different types of memory cells can be used.

Figure 3:
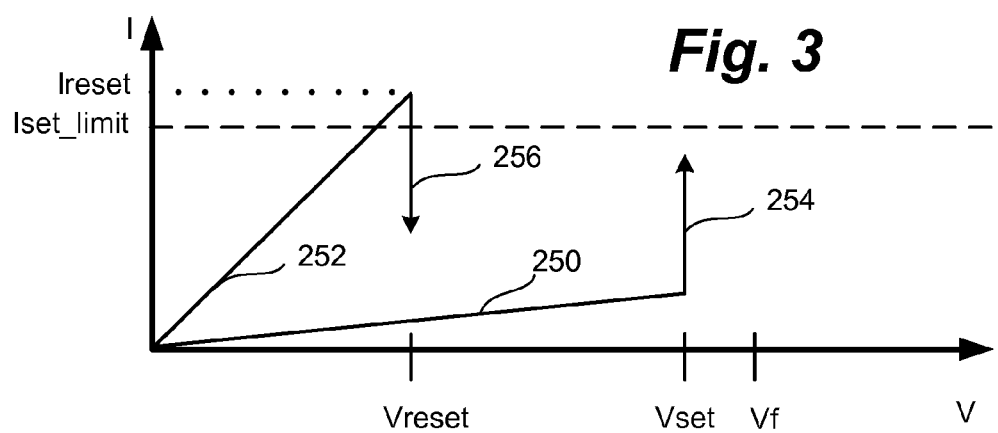
FIG. 3 is a graph depicting I-V characteristics of a reversible resistance-switching element.

FIG. 3 is a graph of voltage versus current for one example embodiment of a metal oxide reversible resistance-switching element. Line 250 represents the I-V characteristics of the reversible resistance-switching element when in the high-resistance state. Line 252 represents the I-V characteristics of the reversible resistance-switching element when in the low-resistance state. To determine which state the reversible resistance-switching element is in, a voltage is applied and the resulting current is measured. A higher measured current (see line 252) indicates that the reversible resistance-switching element is in the low-resistance state. A lower measured current (see line 250) indicates that the reversible resistance-switching element is in the high-resistance state. Note that other variations of a reversible resistance-switching element having different I-V characteristics can also be used with the technology herein.

While in the high-resistance state (see line 250), if the voltage Vset and sufficient current is applied to the memory cell, the reversible resistance-switching element will be SET to the low-resistance state. Line 254 shows the behavior when VSET is applied. The voltage will remain somewhat constant and the current will increase toward Iset_limit. At some point, the reversible resistance-switching element will be SET and the device behavior will be based on line 252. Note that the first time the reversible resistance-switching element is SET, Vf (the forming voltage) is needed to SET the device. After that, VSET can be used. The forming voltage Vf may be greater than VSET.

While in the low-resistance state (see line 252), if the voltage VRESET and sufficient current (Ireset) is applied to the memory cell, the reversible resistance-switching element will be RESET to the high-resistance state. Line 256 shows the behavior when VRESET is applied. At some point, the reversible resistance-switching element will be RESET and the device behavior will be based on line 250.

In one embodiment, Vset is approximately 5 volts, Vreset is approximately 3 volts, Iset_limit is approximately 5 uA and the Ireset current could be as high as 30 uA. In some embodiments, Vset can be lower than Vreset, the forming operation is not needed and/or the time needed to SET or RESET could be different.

The programming operations to SET and RESET the resistance of reversible resistance-switching material are known in the art. Many different implementations of circuits to SET and RESET the resistance of reversible resistance-switching material are known and can be used with the technology described herein.

In some implementations, the SET operation can be followed by a verify operation to see if the SET operation was successful. If not, the SET operation can be retried. In one example implementation, the verify operation is a read operation. Therefore, system control logic 130 will first cause one or more memory cells to be programmed (SET or RESET) and will then read all of the memory cells programmed. If the data read matches the data to be programmed, then the process is complete. If some of the data read does not match the data programmed (most likely because the programming was not successful), then the programming is repeated.

Figure 4A:
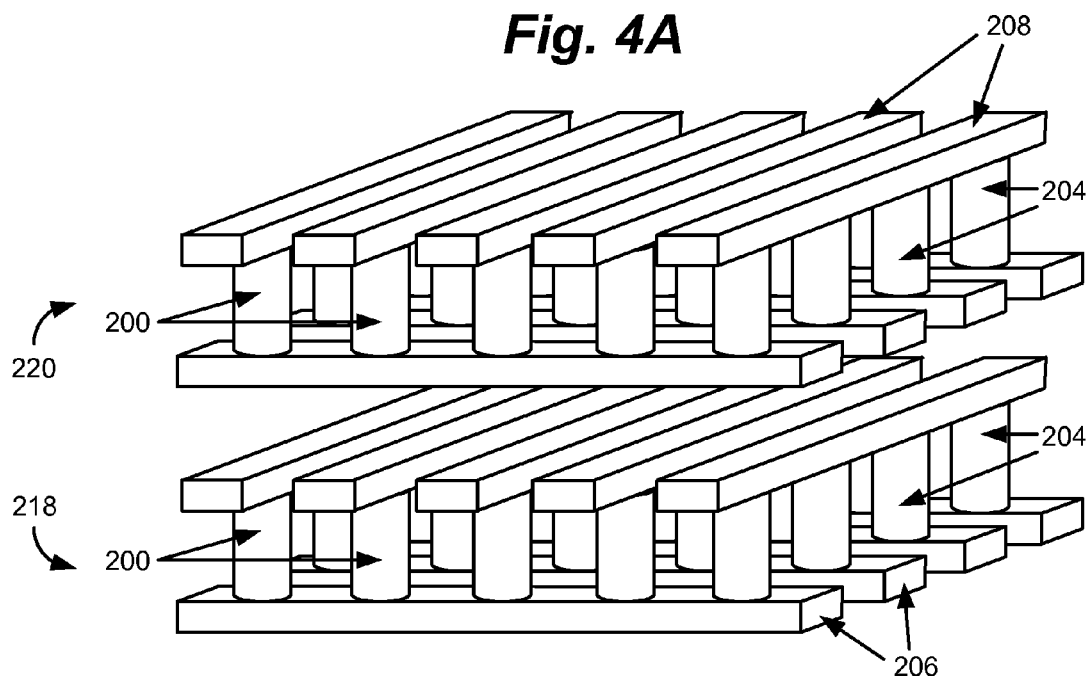
FIG. 4A is a simplified perspective view of a portion of one embodiment of a three-dimensional memory array.

Memory array 102 comprises many memory cells. FIG. 4A is a simplified perspective view of a portion of a monolithic three dimensional array 102 that includes a first memory level 218 positioned below a second memory level 220. In the embodiment of FIG. 4A, each memory level 218 and 220 includes a plurality of memory cells 200 in a cross-point array. It will be understood that additional layers (e.g., an inter-level dielectric) may be present between the first and second memory levels 218 and 220, but are not shown in FIG. 4A for simplicity. Other memory array configurations may be used, as may additional levels of memory. In the embodiment of FIG. 4A, all diodes may "point" in the same direction, such as upward or downward depending on whether p-i-n diodes having a p-doped region on the bottom or top of the diode are employed, simplifying diode fabrication. Memory cells 200 can be the same as or different than memory cell 150.

Figure 4B:
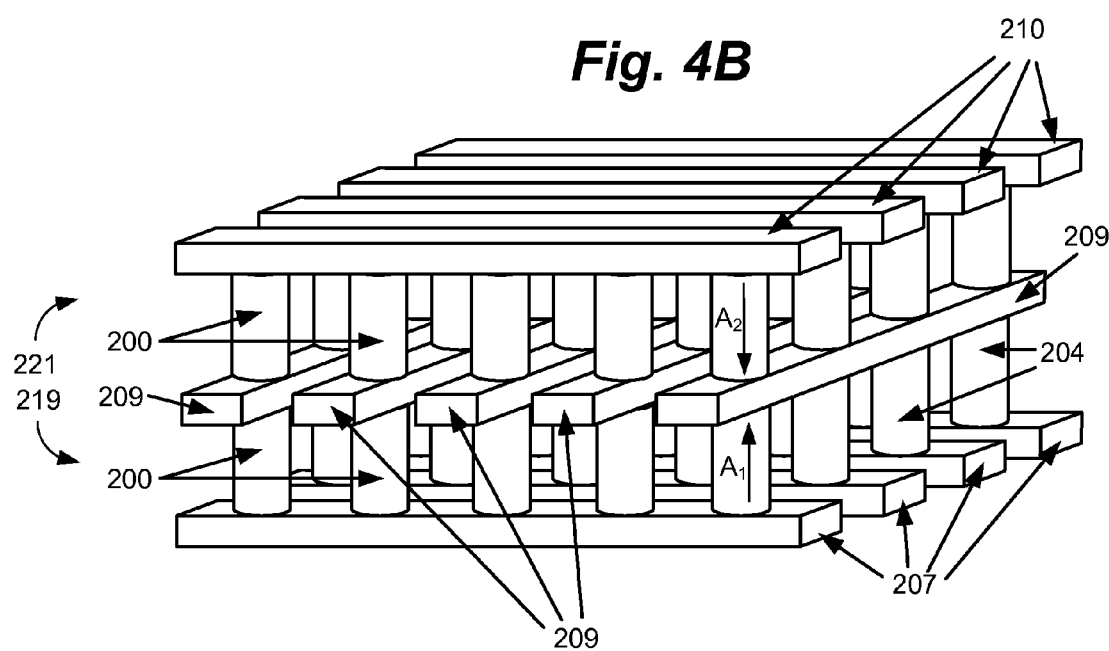
FIG. 4B is a simplified perspective view of a portion of one embodiment of a three-dimensional memory array.

FIG. 4B is a simplified perspective view of a portion of a second embodiment of a monolithic three-dimensional array 102 that includes a first memory level 219 positioned below a second memory level 221. The memory array of FIG. 4B includes a plurality of memory cells 200. With respect to first memory level 219, memory cells 200 are between and connect to a set of bit lines 207 and a set of word lines 209. With respect to second memory level 221, memory cells 200 are between and connect to a set of bit lines 210 and word lines 209. The upper conductors of a first memory level may be used as the lower conductors of a second memory level that is positioned above the first memory level, as shown in FIG. 4B.

In the embodiment of FIG. 4B, the diodes (or other steering devices) on adjacent memory levels point in opposite directions in one example. For example, the diodes of the first memory level 219 may be upward pointing diodes as indicated by arrow $A_1$ (e.g., with p regions at the bottom of the diodes), while the diodes of the second memory level 221 may be downward pointing diodes as indicated by arrow $A_2$ (e.g., with n regions at the bottom of the diodes), or vice versa.

Figure 5A:
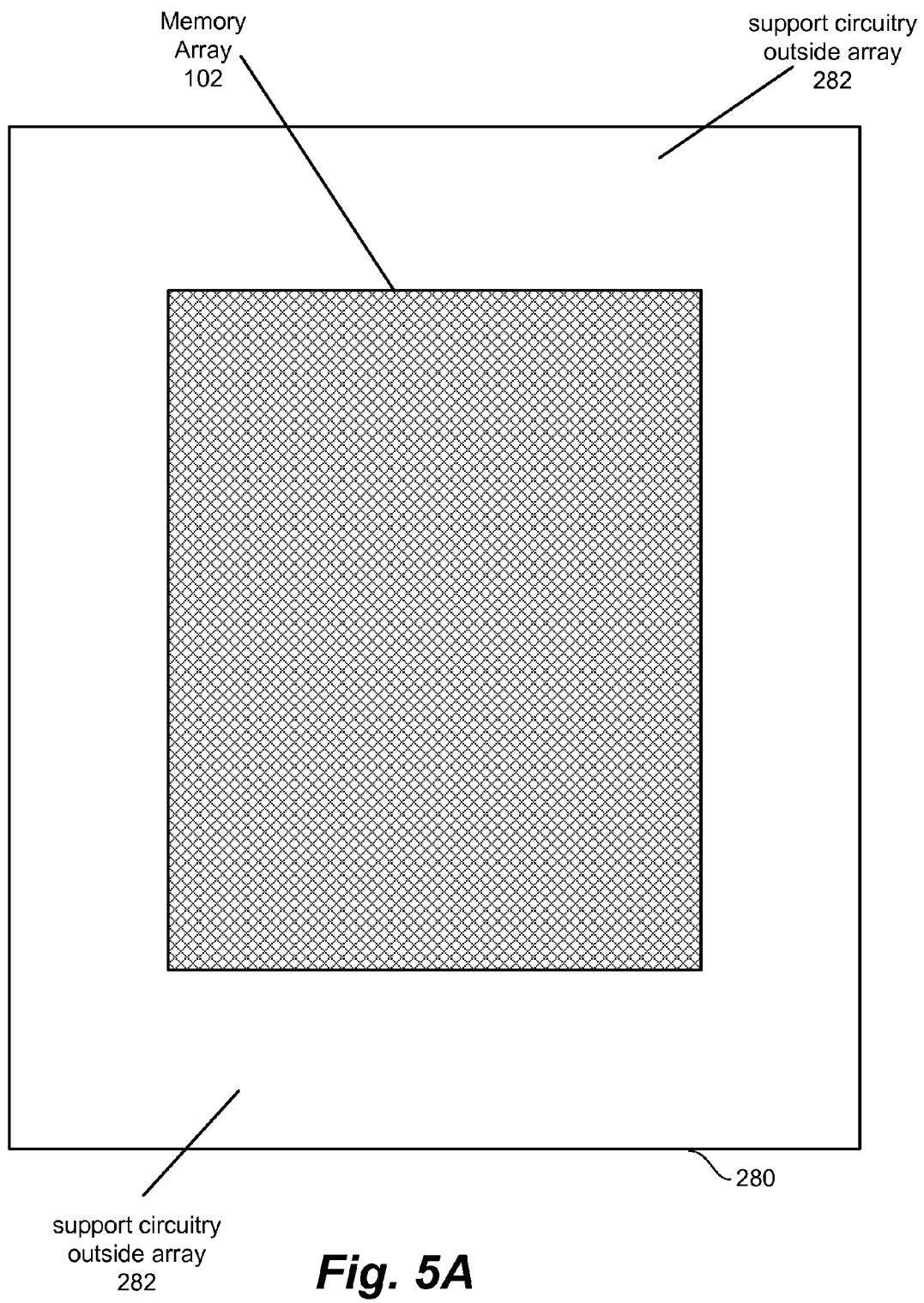
FIG. 5A depicts a top view of a memory system.

In one embodiment of a monolithic three-dimensional memory array, the bit lines are arranged in a first direction and the word lines are arranged in a second direction perpendicular to the bit lines. In a monolithic three-dimensional memory array with additional layers of memory cells, there are additional layers of bit lines and word lines. The supporting circuitry (e.g., column control circuitry 110, row control circuitry 120, and system control logic 130) are arranged on the surface of the substrate with the memory array fabricated above all or a portion of the supporting circuitry. For Example, FIG. 5A shows a top view of memory array 102 positioned over substrate 280. Support circuitry 282 is positioned on the surface of substrate 280. Memory array 102 is positioned above support circuitry 282. Some of the support circuitry 282 is below memory array 102. Some of the support circuitry 282 is outside of memory array 102. By "outside of the memory array" it is meant that the memory array is not positioned over the circuitry that is outside of the memory array.

FIG. 5B, which depicts various layers of an integrated circuit, shows the Memory Array positioned above the Substrate. The Memory Array includes bit line layers BL0, BL1 and BL2, and word line layers WL0 and WL1. In other embodiments, additional bit line and word line layers can also be implemented. An integrated circuit implementing a semiconductor memory system also includes multiple metal layers used for routing signals between different components of the support circuitry, and between the supporting circuitry and the bit lines and word lines. These metal layers are arranged above the support circuitry that is implemented on the surface of the Substrate and below the Memory Array. FIG. 5B shows two metal layers R1 and R2 used for routing; however, other embodiments can include more or less than two metal layers. In one example, these metal layers R1 and R2 are formed of Tungsten (about 1.5 ohm/square), which has both a relatively high resistance and high capacitance.

Positioned above the memory array can be one or more metal layers used for routing signals between different components of the memory system. FIG. 5B shows one such metal layer above the memory array, labeled as the Top Metal layer. In one example, the top metal layer is formed of aluminum or copper (about 0.05 ohm/square), which has a smaller resistance and capacitance than layers R1 and R2. Metals layers R1 and R2 are not implemented using the same materials as used for the Top Metal because the metal used for R1 and R2 needs to withstand the processing steps for fabricating the memory array on top of R1 and R2.

Vias can be added to make connections between adjacent metal layers. Zias can be added to make connections between layers that are not adjacent. A zia is a multi-layer via and can connect more than 2 layers (in which case the zia looks like a staircase).

Figure 6:
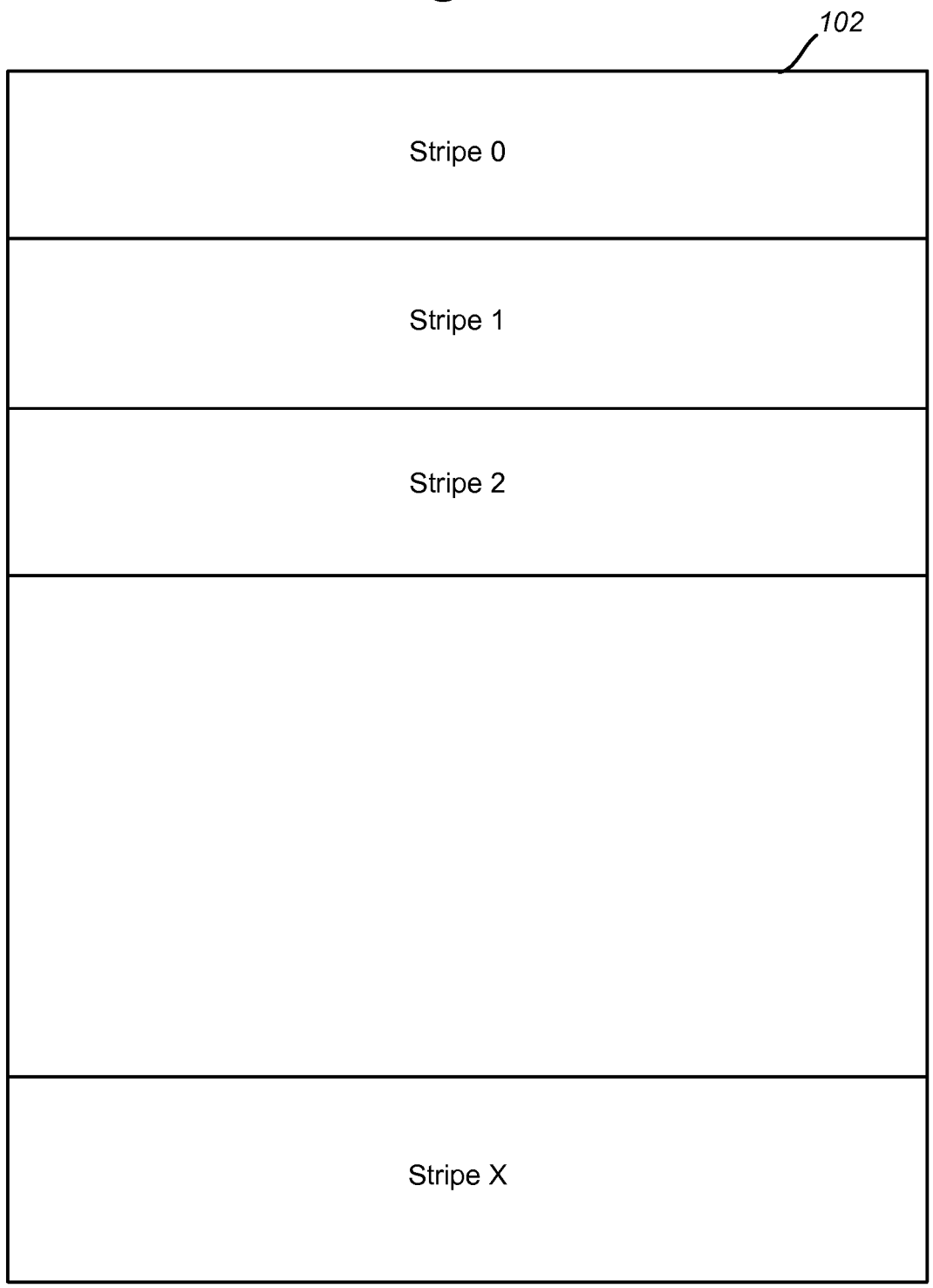
FIG. 6 depicts one example of an organization of a memory array.

Memory array 102 is subdivided into stripes, as depicted in FIG. 6. Each stripe is divided into blocks and blocks are grouped into bays. In one embodiment, each block includes two stripes. In other embodiments, one bay can be implemented in one stripe or a portion of one stripe. In some implementations, a bay can be implemented across all or portions of two or more stripes. Each bay includes multiple blocks. The number of blocks in a bay can vary.

Figure 7:
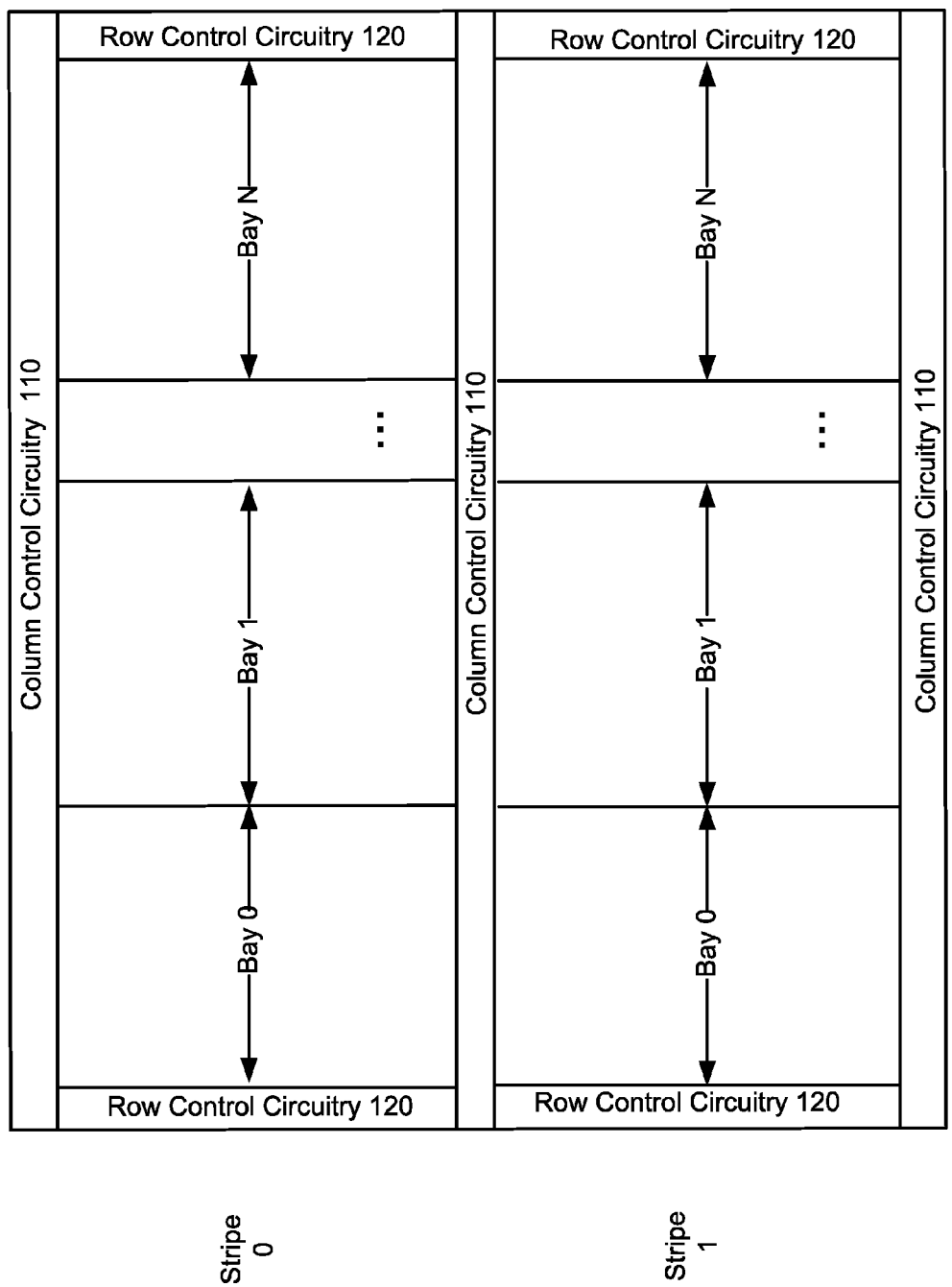
FIG. 7 depicts one embodiment of the structure of two stripes of a memory array.

FIG. 7 shows one example implementation of two stripes (Stripe 0 and Stripe 1), where each bay (Bay 0, Bay 1, . . . , Bay N) is implemented across a portion of two neighboring stripes. For example, Bay 0 is partially in Stripe 0 and partially in Stripe 1. Therefore, in the example of FIG. 7, a bay includes memory cells in two stripes. The number of bay in a stripe can vary. FIG. 7 shows Column Control Circuitry 110 on opposite sides of a stripe (e.g., top and bottom) and Row Control Circuitry on different opposite sides of a stripe (e.g., left and right).

Figure 8:
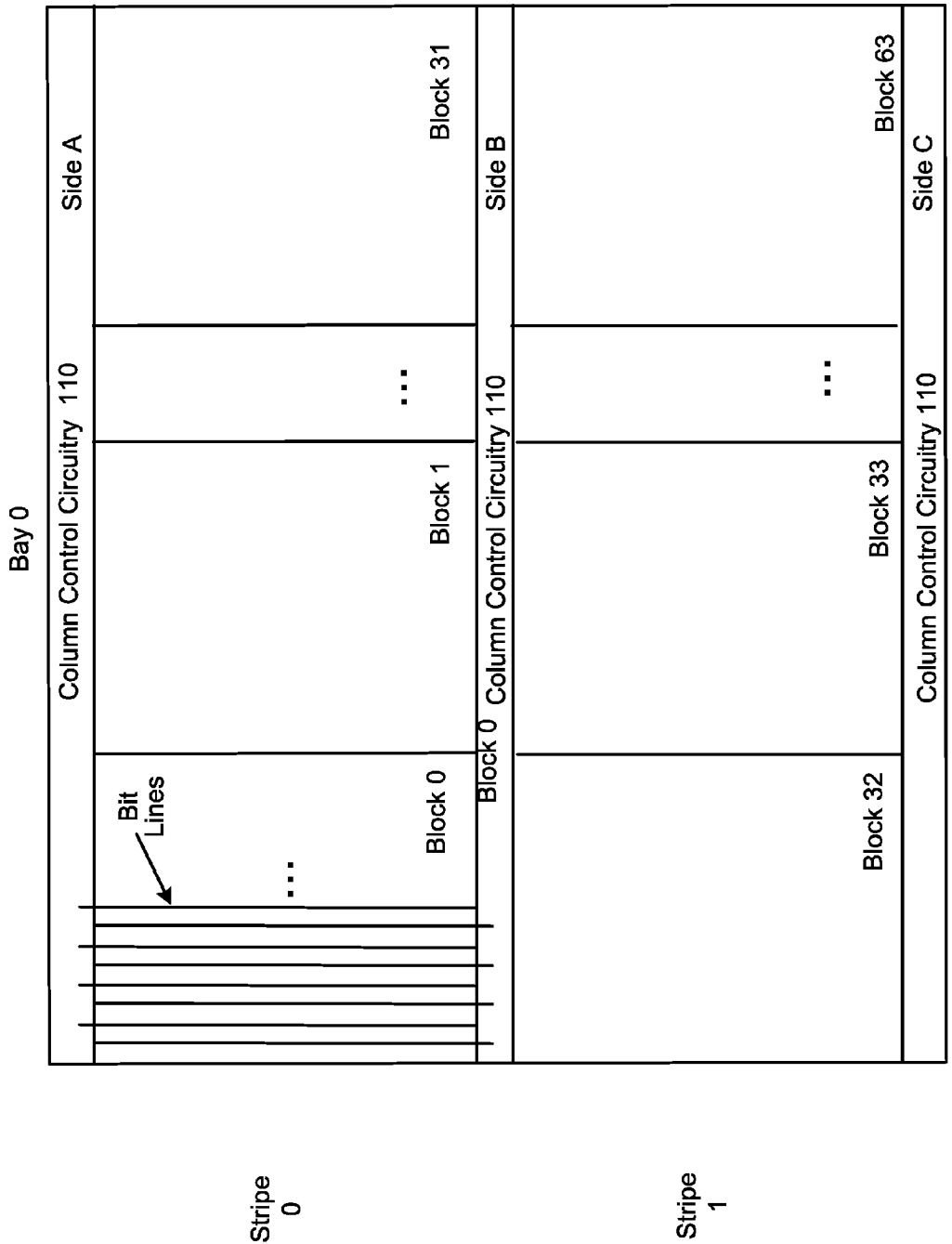
FIG. 8 depicts one embodiment of a bay.

FIG. 8 provides more details of one example of a bay (e.g., Bay 0), that is implemented across two stripes (e.g., strip 0 and stripe 1). In one embodiment, a bay has sixty four blocks with Block 0, Block 1, . . . , Block 31 in Stripe 0 and Block 32, Block 33, . . . , Block 63 in Stripe 1. However, other embodiments can implement a different number of blocks.

A block is a contiguous group of memory cells having contiguous word lines and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. An integrated circuit may include one or more than one memory array.

FIG. 8 shows a subset of the Bit Lines for Block 0. The substrate is wider than the memory array; therefore, portions of the Column Control Circuitry 110 can protrude out from under the memory array to facilitate connections using zias and vias to R1, R2, Top Metal, and the bit lines, while other portions of Column Control Circuitry 110 can be positioned under the memory array. Column Control Circuitry 110 (including decoders and sense amplifiers) is divided into two sets of circuits, with each set of circuits being located on opposite sides (e.g. Side A and Side B) of the integrated circuit so that one set of circuits of Column Control Circuitry 110 protrudes out from a first side (Side A) of the memory array and the second set of circuits of Column Control Circuitry 110 protrudes out from the opposite side (Side B) of the memory array. Half of the bit lines for a block are connected to one set of circuits of Column Control Circuitry 110 on side A and the other half of the bit lines for a block are connected to the second set of circuits of Column Control Circuitry 110 on side B. In one embodiment, these two sets of bit lines are interleaved so that every other bit line connects to Column Control Circuitry 110 on side A and the intervening bit lines connect to Column Control Circuitry 110 on side B. There could be cases in which two neighboring bit lines are picked from side A and the next 2 from side B. This depends on process. Other blocks in the bay are similarly arranged (e.g., sides B and C, etc.). In one embodiment, the bit lines are shared between upper and lower blocks. For example, even bit lines in Block 32 of Stripe 1 are shared with even bit lines in Block 0 of Stripe 0. Similarly, odd bit lines in Block 32 of Stripe 1 are shared with odd bit lines in Block 0 of Stripe 0. In this manner, column control circuitry 110 can decode and drive bit lines for its upper or bottom blocks.

In one embodiment, word lines (not depicted in FIG. 8) are shared by two adjacent blocks. For example, half of the word lines connected to Block 1 are also connected to Block 0 and the other half of the word lines connected to Block 1 are also connected to Block 2. In one example, every other word line connected to Block 1 is also connected to Block 0, with the intervening word lines also connected to Block 2. For embodiments with word lines shared by two adjacent blocks, the word line drivers are positioned on the substrate and between the two adjacent blocks. For example, a word line connected to Block 0 and Block 1 is driven by a word line driver positioned between Block 0 and Block 1. In this manner, a word line driver is in the middle of the memory cells it is driving. Such an arrangement reduces the resistance experienced by the signal driven by the word line driver and reduces the IR drop along the word line when concurrently programming multiple memory cells that are located on both sides of the driver.

In one embodiment, there are two sense amplifiers for each block located below the blocks, for example, on the surface of the substrate. One of the two sense amplifiers are for bit lines that connect to Column Control Circuitry 110 on side A and the other sense amplifier is for bit lines that connect to Column Control Circuitry 110 on side B. In one embodiment that includes 64 blocks in a bay, there are 64 sense amplifiers for a bay with 32 for side A and 32 for side B. In one embodiment, one property of a bay is that all of the blocks in the bay share the same 64 sense amplifiers. That means that 64 memory cells in a bay can be simultaneously selected for programming or reading. Thus, the memory system includes circuits for selecting the 64 memory cells and lines for routing signals between the 64 selected memory cells and the sense amplifiers. In some embodiments, less than 64 memory cells are selected for simultaneous programming in order to limit the power used at any given time.

To reduce resistance and capacitance in data lines between selected memory cells and the sense amplifiers, a sectional data line scheme can be used. Local data lines are provided for each section, where a section can include one, two, four, or another number of blocks. Selection circuits are used to connect the local data lines to the appropriate bit lines. Sense amplifier outputs are provided to global data lines across all blocks in the bay. Selection circuits are used to connect the global data lines to the appropriate local data lines.

Figure 9:
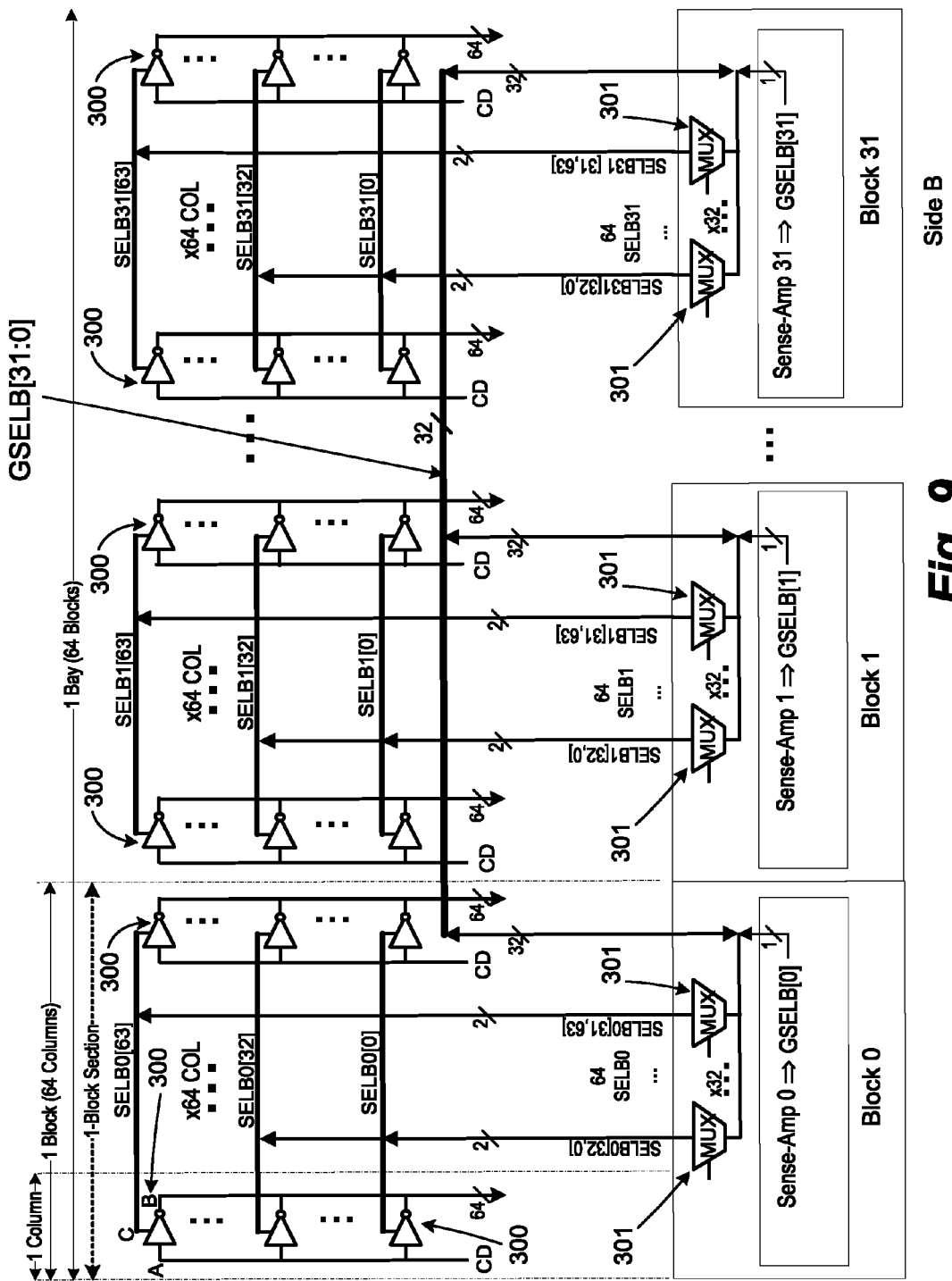
FIG. 9 is a schematic diagram of one embodiment of the data lines and selection circuits for connecting bit lines to the column control circuitry via the data lines.

FIG. 9 is a schematic diagram that depicts a portion of the routing signals and selection circuits for one embodiment of Column Control Circuitry 110. Depicted are portions of three blocks: Block 0, Block 1 and block 31. For each block, the bit lines are grouped into columns. Each block has 64 columns of selection circuits 300 for electrically connecting bit lines of the column to sense amplifiers on one side of the array (e.g. side A FIG. 8) and 64 columns of selection circuits for connecting bit lines to sense amplifiers on the other side of the array (e.g. side B of FIG. 8). FIG. 9 only shows the 64 columns of selection circuits 300 for connecting to side B. Each block, therefore, has 64 columns×64 bit lines per column×2 (top and bottom)=8192 bit lines for every block. In one embodiment, the three dimensional memory array includes four layers, with 2048 bit lines per layer. Other arrangements of the decoding circuits, bit lines and layers can also be used.

In the embodiment of FIG. 9, each block has its own set of local data lines. For example, block 0 includes SELB0 [63:0], block 1 includes SELB1[63:0], ... block 31 includes SELB31[63:0]. In one embodiment, the local data lines SELB0[63:0], SELB1[63:0], SELB31[63:0] are implemented in metal layer R1 under their respective block, and only run the width of the respective block. Selection circuits 300 for a particular column are used to selectively connect the 64 bit lines for that same column to 64 respective local data lines (SELB0[63:0], SELB1[63:0], ... or SELB31[63: 0]). As can be seen from FIG. 9, each of the selection circuits 300 receives a selection signal CD from column decoders 112 and a bit line connection from one of the 64 bit lines associated with the column. In one embodiment, each column will have its own selection signal CD. Based on the selection input from column decoder 112, the selection circuit 300 will connect or disconnect the bit line to a respective one of the local data lines (e.g., SELB0[63:0], SELB1[63:0], SELB31[63:0]).

Looking back at FIG. 8, column decoders 112 choose one column and send to that chosen column a selection indication on the appropriate selection signal line CD so that the chosen column connects the respective 64 bit lines to the local data lines (SELB0[63:0], SELB1[63:0], ... or SELB31 [63:0]). Each block has its own set of thirty two 2:1 multiplexers (e.g., MUX 301) that are associated with the block and located on the substrate below the block. Each set of sixty four local data lines (SELB0[63:0], SELB1 [63:0], ... or SELB31[63:0]) are connected to a respective set of thirty two 2:1 multiplexers (MUX) for that respective block. For example, in block 0 the first multiplexer receives SELB0[0] and SELB0[32], the second multiplexer receives SELB0[1] and SELB0[33], ... the thirty second multiplexer receives SELB0[31] and SELB0[63]. Each of the multiplexers in a block receives a common selection signal and an enable signal from column decoders 112 so that thirty two of the sixty four local data lines are selected. In one embodiment, the multiplexers include the ability to bias the unselected SELB with the unselected bit line voltage VUB.

The thirty two selected local data lines are connected to global data lines GSELB[31:0] so that a memory operation (e.g. Read, SET, RESET) is performed on the selected memory cells. For example, SELB0[0] is selectively connected to GSELB[0], SELB0[1] is selectively connected to GSELB[1], etc. or SELB0[32] is selectively connected to GSELB[0], SELB0[33] is selectively connected to GSELB [1], etc. The global data lines GSELB[31:0] are implemented in Top Metal and connections between global data lines GSELB[31:0] and multiplexers (MUX) are made using zias (or vias). The global data lines GSELB[31:0] run across the entire Bay, with each Bay having its own set of global data lines. To reduce coupling between global data lines, various forms of Top Metal isolation can be used.

Each of the global data lines GSELB[31:0] are connected to one of the sense amplifiers. For example, the output Sense-Amp0 of the sense amplifier located underneath block 0 is connected to GSELB[0], the output Sense-Amp1 of the sense amplifier located underneath block 1 is connected to GSELB[1], ... and the output Sense-Amp31 of the sense amplifier located underneath block 31 is connected to GSELB[31]. Thus, the output of a particular sense amplifier is connected to a global data line, then to a local data line by way of a multiplexer, and then to a bit line by way of a selection circuit 300. Because the global data lines are implemented in Top Metal, and Top Metal has significantly less resistance than metal layers R1 and R2, the signal path from the sense amplifiers to the memory cells has a lower resistance. Capacitance is also reduced because the number of transistors that are "off" and are touched by the decoding line is reduced. The total parasitic capacitance of the bit line drivers (source-to-well parasitic cap) is reduced by having a sectional data-line, by reducing number of bit line drives for each data-line (SELB).

As mentioned above, FIG. 9 only shows the connection paths to sense amplifiers on one side (e.g., side B) of the blocks. Thus, there is another set of local data lines for each block, another set of global data lines for each bay and another set of sense amplifiers for each bay in addition to that which is depicted for FIG. 9. Therefore, a selected block is associated with 128 selected bit lines that are connected to 128 local data lines, for which 64 multiplexers choose 64 local data lines to connect to 64 global data lines. The 64 global data lines are connected to 64 sense amplifiers associated with that particular bay. Therefore, at any given time 64 memory cells in a block can be simultaneously programmed. In some embodiments, less than 64 memory cells in a block will be simultaneously programmed to reduce power. The choice of 64 blocks in a bay, 128 bit lines in a column, using 128 local data lines, and 64 global data lines is for one set of embodiments. In other embodiments, different numbers of each item can be used.

Figure 10:
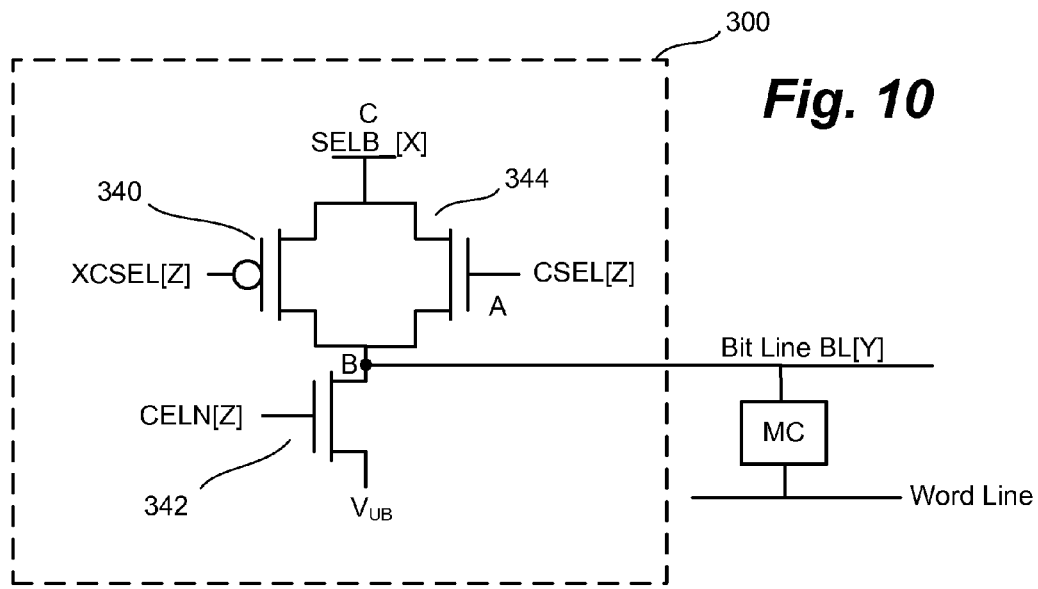
FIG. 10 is a schematic diagram of one embodiment of a selection circuit.

FIG. 10 is a schematic diagram showing the details of one embodiment of selection circuits 300. The selection circuit 300 is connected to one of the local data lines (labeled in FIG. 9 as SELB_[X]) and one of the bit lines. The bit line is connected to one terminal of the memory cell MC. A word line is connected to the other terminal of the memory cell MC. Selection circuit 300 includes p-channel transistor 340 and n-channel transistor 344 both connected to SELB_[X] at node C. Transistor 340 and transistor 344 are also both connected to n-channel transistor 342 at node B. The respective bit line BL[Y] is also connected to node B. Transistor 342 is also connected to VUB (e.g. 0.5 v), the unselected bit line voltage. The gate of transistor 340 is connected to selection signal XCSEL[Z]. The gate of transistor 344 is connected to selection signal CSEL[Z] at node A. Note that XCSEL[Z] is an inverted version of CSEL[Z]. The gate of transistor 342 is connected to CELN[Z]. The signals CSEL [Z], XCSEL[Z], and CELN[Z] are provided by column decoder 112. In other embodiments, those signals can be provided by other circuits, such as system control logic 130, driver circuitry 114, sense amps 118 or other portions of column control circuits. The signal CELN[Z] is independently controlled so that transistor 342 can be independently controlled from transistors 340 and 342. Each column will have its own independent CELN[Z] so that all bit lines in that column have the same CELN[Z]. CSEL[Z] of FIG. 10 is analogous to CD of FIG. 9.

When the respective column is selected, XCSEL[Z] is 0 and CSEL[Z] is 1; therefore, transistors 340 and 344 are on. This condition connects the bit line BL[Y] with the local data line SELB[X].

When the respective column is not selected, then XCSEL [Z] is 0 and CSEL[Z] is 1; therefore, transistors 340 and 344 are off. This condition disconnects the bit line BL[Y] from the local data line SELB[X]. When transistors 340 and 344 are off and CELN[Z] is 1, then transistor 342 is on and the bit line BL[Y] is receiving the unselected bit line voltage VUB via the re-channel transistor 342. When transistors 340 and 344 are off and CELN[Z] is 0, then transistor 342 is off and the bit line BL[Y] is floating. This condition is useful for the some embodiments of the capacitance discharge method of programming described herein.

Figure 11:
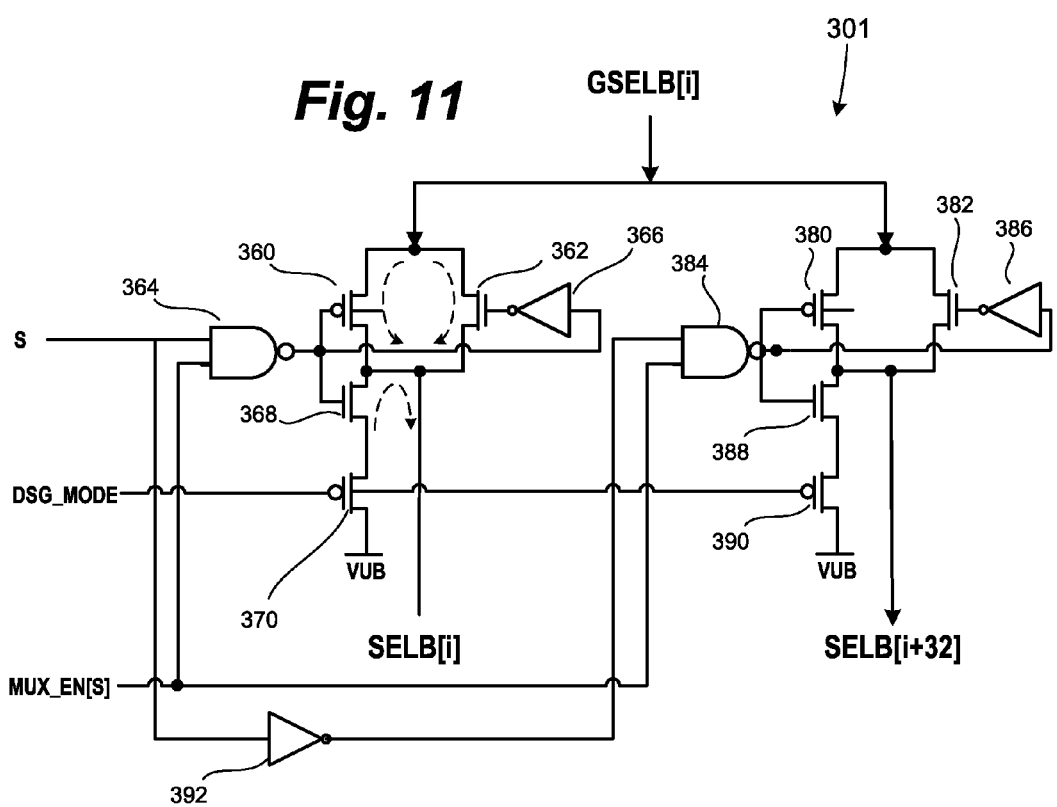
FIG. 11 is a schematic diagram of one embodiment of a multiplexer circuit.

FIG. 11 is a schematic of a circuit for the 2:1 multiplexer (MUX 301) depicted in FIG. 9. The respective global data line GSELB[i] is connected to transistors 360, 362, 380 and 382. Transistors 360 and 362 are also connected to the first of the two local data lines SELB[i]. Thus, transistors 360 and 362 provide a path between the global data line GSELB[i] and the local data line SELB[i] when the transistors are on. In addition to being connected to GSELB[i], transistors 380 and 382 are also connected to the second local data line SELB[i+32]. Thus, transistors 380 and 382 provide a path between global data line GSELB[i] and the second local data line SELB[i+32] when the transistors are on.

The gate of transistor 360 is connected to the output of NAND gate 364. The gate of transistor 362 is connected to the output of inverter 366. The input of inverter 366 is connected to the output of NAND gate 364. The output of NAND gate 364 is also connected to the gate of transistor 368. Transistor 368 is connected between SELB[i] and transistor 370. Transistor 370 is connected between transistor 368 and the voltage VUB. The gate of transistor 370 receives the signal DSG_MODE from system control logic 130. The signal DSG_MODE is set to 1 when performing one of the possible embodiments of the programming operation using the capacitance discharge mode of programming described herein. By setting signal DSG_MODE to 1, transistor 370 will prevent an unselected local data line from being connected to VUB and, instead, cause the unselected local data line to float.

The output of NAND gate 384 is connected to the gate of transistor 380, the input of inverter 386 and the gate of transistor 388. The output of inverter 386 is connected to the gate of transistor 382. Transistor 388 is connected between local data line SELB[i+32] and transistor 390. Transistor 390 is connected between transistor 388 and the voltage VUB. The gate of transistor 390 receives the signal DSG_MODE from system control logic 130. When DSG_MODE is set to 0 and SELB[i] is selected, SELB[i+32] receives VUB via p-channel transistor 390 (in some embodiments). When DSG_MODE is set to 0 SELB[i+32] is selected, SELB[i] receives VUB via p-channel transistor 370 (in some embodiments). The signal DSG_MODE is designed for use with the capacitive discharge method described above. When DSG_MODE is set to 1, SELB[i] can be charged up according to the data pattern. The signal MUX_EN[S] is disabled, and the signals SELB[i] and BL[i] are floating. The selected word line goes low and selected memory cells are programmed.

NAND gate 364 receives two inputs from system control logic 130: multiplexer select S and MUX_EN[S]. NAND gate 384 receives two inputs from system control logic 130: an inverted version of multiplexer selection signal S (via inverter 392) and MUX_EN[S]. The signal MUX_EN[S] is normally set to 1 during a memory operation, but can be set to 0 to disable the multiplexer. MUX_EN[S] may be used to disable the multiplexer when less than all 32 global data lines will be used for simultaneous programming. In one embodiment, two different MUX_EN[S] signals each connected to half the multiplexors are used to selectably connect half the GSELB bus to half of the local SELB[i] bus. In this case sixteen bit lines can be selected for simultaneous programming.

The circuits of FIGS. 8-11 can be used to implement the capacitive discharge method of programming discussed above. The circuit of FIG. 10 will be used to connect a column of bit lines to the local data lines SELB[63:0] and the circuit of FIG. 11 is used to connect half of the local data lines SELB[63:0] to the global data lines GSELB[32:0]. Once both connections are made, the thirty two sense amplifiers for side B are in communication with thirty two memory cells via the global data lines, the local data line and the bit lines for each side. During a SET operation, the sense amplifiers will apply a voltage to the global data lines to charge up the global data lines due to the parasitic capacitance of the global data lines. When the multiplexers of FIG. 11 (which are one embodiment of a selection circuit) connect the local data lines to the global data lines, then the local data lines will also be charged up. When the selection circuits of FIG. 10 (which are one embodiment of a selection circuit) connect the local data lines to a set of bit lines, the selected bit lines will also be charged. Once the bit lines are charged, the signals XCSEL[Z] and CSEL [Z] are toggled, which cuts off the bit line and leaves the bit line floating so that over time the bit line will discharge through the memory cell causing the memory cell to SET, as described above. Once the signals XCSEL[Z] and CSEL [Z] are toggled, the word line selection can change so that programming for the next word line will commence.

For many memory arrays, like that of FIG. 9, write operations are divided into cycles. Many chip architectures divide write processes into bay address (BAD) cycles so that less than all of the bays are written simultaneously. Each bay may be written separately or multiple bays may be grouped together into a bay group that is written during one bay address (BAD) cycle. For example, if the memory array is divided into sixteen bays and the bays are divided into eight bay groups with two bays in each bay group, there are eight bay addresses for programming the sixteen bays in eight BAD cycles. If each bay is programmed individually, there are sixteen BAD's for programming the sixteen bays in sixteen cycles.

BAD cycles may be divided into column address (CAD) cycles. In many architectures, the number of sense amplifiers (sense amps) for the memory array is less than the number of bits written during a typical write operation. Consider an example where each bay has 32 blocks and each block includes one sense amplifier and 32 columns. The sense amplifiers in each bay can access each block within the bay. Additionally, the sense amplifiers in each bay can access each block within the same stripe. Nevertheless, the memory capacity of the available sense amplifiers for a write operation is less than the amount of data received for most program commands.

For example, typical requests to write data to the memory array include a unit or group of data referred to as a page of data. While page sizes may vary by implementation, it is common for a page of data or the page size to be 2048 KB. Because the capacity of the available sense amps to program a page of data is less than 2048 KB, the program or write operation is divided into cycles to sequentially program the page of data in chunks that are less than the total page size. In the above example, the total number of sense amps on the chip is equal to the product of the number of sense amps per bay (32) multiplied by the number of bays (16), or 512 in this example. If the page size for programming is 2048 KB and each sense amp is capable of storing one bit of data, a page of data received with a write request is programmed in 32 different cycles, with each cycle programming 512 bits. These cycles, defined by the quotient of the page size and the total number of sense amps, are typically referred to as column address (CAD) cycles. Thus, each BAD cycle will include multiple CAD cycles. If the BAD cycle includes multiple bays, the CAD cycle typically provides the same CAD to each bay in the bay group to select the CAD spanning the bays of the group.

In addition to BAD cycles and CAD cycles, many memory systems divide the write operation into sense amplifier address (SAD) cycles for power consumption control and other reasons such as program disturb. For example, while every sense amp can be enabled at a given time during write operations, many chip architectures enable less than all of the sense amps at a given time to minimize power consumption and undue voltage drops or currents on chip. In the above example, the 32 sense amplifiers for a bay may be divided into 8 sense amplifier addresses for programming in individual cycles for each column address. In this example, each cycle will program 4 bits in parallel. This number of bits can be referred to as the number of allowable parallel programmable bits. The architecture may establish that the maximum number of bits that should be programmed in a block is less than the available number of sense amplifiers for the reasons noted above. For example, if a single sense amplifier is enabled at a time for each CAD cycle, there would be 32 sense amplifier addresses and cycles within each CAD cycle. If two sense amplifiers were enabled in each CAD cycle, the number of SAD cycles for each CAD cycle would be 16, etc.

Figure 12:
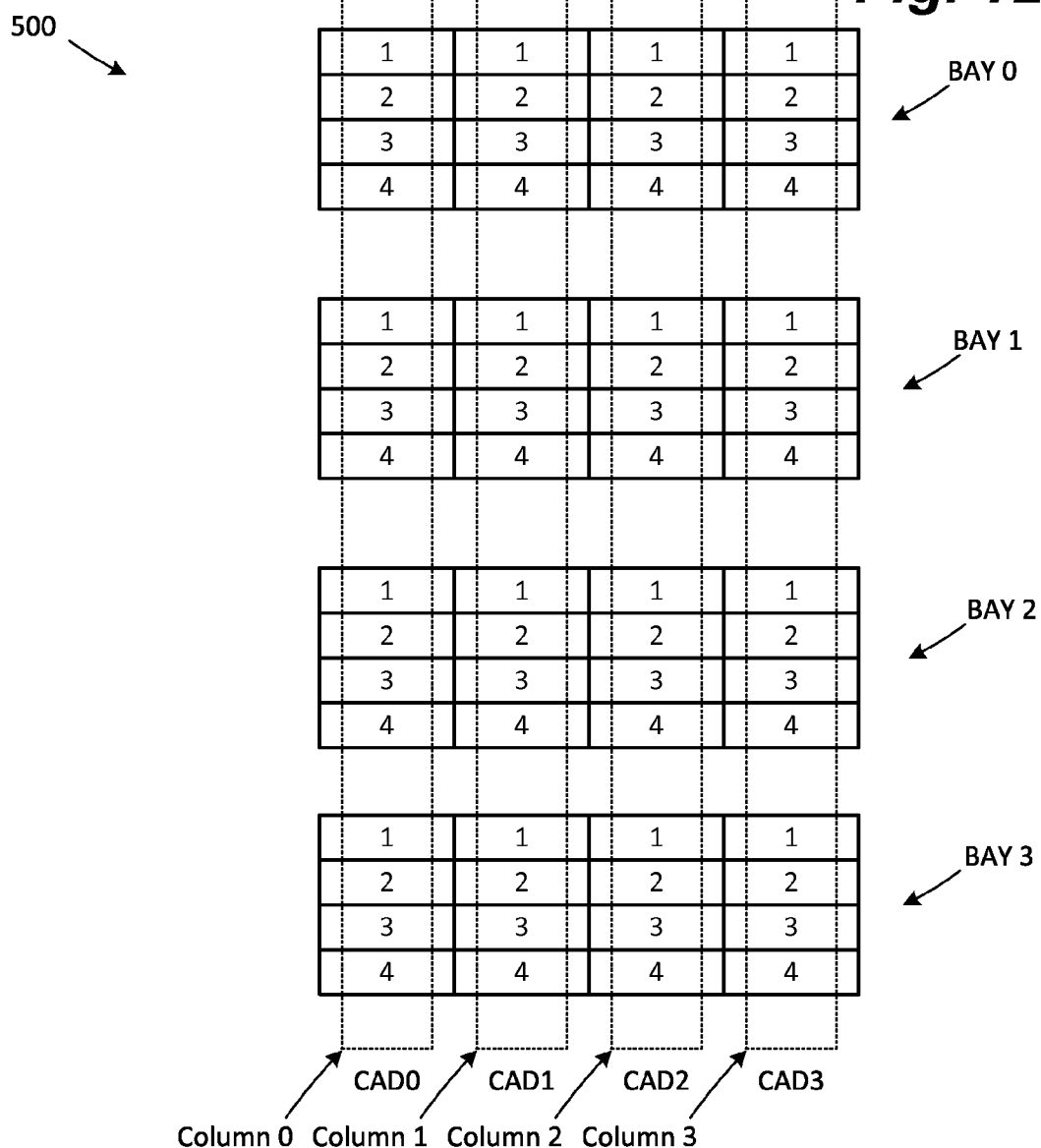
FIG. 12 is a block diagram of a portion of a non-volatile memory array describing a bay and column architecture.

FIG. 12 is a simplified block diagram of a portion of a non-volatile memory array illustrating details of a bay and column architecture in one example. FIG. 12 depicts a bay group 500 including bays, Bay 0, Bay 1, Bay 2 and Bay 3. Each bay includes a portion of four columns. Although not shown, a column may include a plurality of bit lines as earlier described. Each column is addressed by a column address CAD0, CAD1, CAD2, or CAD3. Each column includes a subset of memory cells at each bay. In this simplified example, each column includes four memory cells at each bay. The four memory cells may be associated with four word lines in one example. In another example, each numbered box in FIG. 12 may represent a group of memory cells associated with one word line and multiple bit lines of the column.

Memory data can be stored in the bays by distributing a logical page of data across each of the bays. In this particular example, each bay includes a first row that stores memory for a first page of data, a second row that stores memory data for a second page of data, a third row that stores memory data for a third page of data and a fourth row that store memory data for a fourth page of data.

Figure 13:
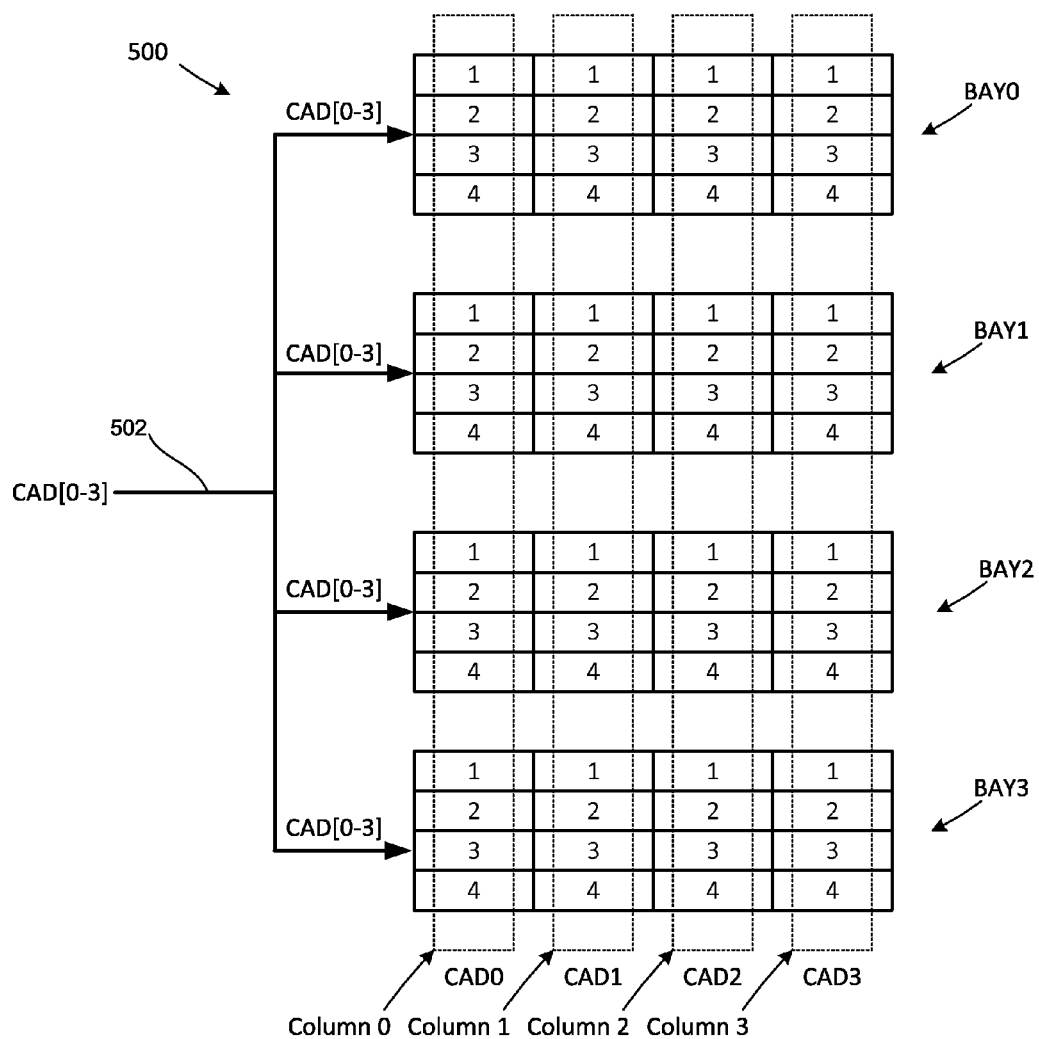
FIG. 13 is a block diagram depicting a bay and column architecture with column address select lines for a bay group.

FIG. 13 is a simplified block diagram depicting the bays and columns of FIG. 12 with a set of select lines. In a typical architecture as shown in FIG. 13 a single select line 502 provides the column address from the state machine to the bays of a bay group at the memory array. In FIG. 13 for example the column address signal may select one of Columns 0-3 using column addresses CAD0, CAD1, CAD2 or CAD3. The select line for a bay group routes the column address to each of Bays 0-3. In this manner, the control circuitry is able to select an entire column of memory cells that spans multiple bays using a single column address signal and single column address.

It is possible for memory data that is stored in the memory array to match user data to be programmed to the memory array as part of a write request. For example, a sequential series of bits of the user data to be programmed may match memory data in the memory cells. This may occur during re-writes to program memory cells that were not successfully programmed during an earlier programming iteration of the write process. The memory system may read back a unit of data such as a page after programming and verify that the page matches the data to be programmed. If not all of the data matches (or less than a predetermined number of bits match), then the page will be reprogrammed. Memory data may match user data for other reasons. For example, in an image file it is possible that portions of the image are white and that the appropriate data for the white is already stored as memory data in the corresponding memory cells. When reprogramming the page, it is possible that portions of the data can be skipped because the memory data matches the user data to be programmed.

Some systems permit skipping programming for bay groups when user data matches memory data for a bay group. FIGS. 14-15 are tables showing an example of a bay group architecture and traditional skip process. FIG. 14 shows a division of sixteen bays into four bay groups. A first Bay Group 0 includes Bay 0, Bay 1, Bay 2, and Bay 3. Bay Group 1 includes Bay 4, Bay 5, Bay 6, and Bay 7. Bay Group 2 includes Bay 8, Bay 9, Bay 10, and Bay 11. Bay Group 3 includes Bay 12, Bay 13, Bay 14, and Bay 15. Programming for a bay group may be skipped when memory data stored in the memory cells of the bay group match the user data for a write operation. Traditionally, a system may analyze each bay of a bay group to determine if the memory data in all of the bays matches the user data. If all of the bays of a group match the user data, the system can skip programming for the bay group during a bay group programming cycle.

FIG. 15 depicts the table of FIG. 14 along with an example of a skip analysis performed for the four bay groups. The system reads the memory data from each of the bay group and compares the memory data with the user data for a write operation. After comparing the user data to memory data in this particular example, the data read from Bay 0 is determined not to match the user data for Bay 0. Accordingly, the memory system determines that Bay 0 should not be skipped (unskip) during the next programming cycle. Similar evaluations are done for Bays 1, 2, and within Bay Group 1, each determining that these bays can be skipped during the next cycle. Similarly Bay Group 1 is evaluated to determine that Bays 4, 6 and 7 can be skipped during the next programming cycle while Bay 6 should be programmed (unskip). Bay Group 3 is analyzed and it is determined that all bays can be skipped. Bay Group 4 is analyzed and it is determined that Bays 12 and 14 should programmed while Bays 13 and 15 can be skipped.

In many systems, a bay address is used to select a bay group, thereby selecting every bay within a group. Accordingly, to skip programming for a bay group, each bay within the group must match the user data to be programmed for that bay. If all of the bays within a group match the user data, then programming for the bay group can be skipped. If, however, programming for any of the bays cannot be skipped, programming for the entire bay group is performed. In these systems, a skip analysis for the example of FIG. 15 will determine that programming for Bay Group 2 can be skipped, while programming should be performed for Bay Groups 0, 1, and 3. Accordingly, three bay address cycles will be performed, even though four of sixteen bays are being programmed and the maximum number of parallel programming bays is four in this example.

Some systems also permit skipping programming for a column of memory cells (e.g., a CAD). These systems can determine whether programming for an entire column address across multiple bays can be skipped because the memory data from the column matches the data to be programmed. In one example, while programming data into a first column of memory cells during a write operation, the system evaluates whether programming for a second column of memory cells can be skipped. If the system determines that the second column of memory cells cannot be skipped, the second column of memory cells is programmed when the first column completes. If the system determines that the second column of memory cells can be skipped, the system waits until the first column of memory cells is programmed, and then evaluates whether the third column of memory cells can be skipped. Other systems evaluate and decide to skip multiple columns of memory cells while programming a prior column of memory cells. These systems may also evaluate whether to skip one or more sense amp addresses for a later column while programming an earlier column. Yet other techniques are able to evaluate during a read before write operation whether multiple columns can be skipped. In these systems, bitmap data may be generated and used to determine whether a column can be skipped during programming. In this manner, the system does not wait on a particular column to be programmed before evaluating other columns.

As depicted in FIG. 13, many systems utilize a common column address signal that can be applied to each of the bays within a bay group. In this manner, the system can provide a single column address to each of the bays within a bay group to select one column from the bay group that spans multiple bays for programming. FIG. 16 is a table describing a column and bay architecture in one example along with the results of a skip analysis performed on each of the bays. Each of Bays 0-3 includes a portion of Column 0 that is addressed using column address CAD0, a portion of Column 1 that is addressed using a column address CAD1, a portion of Column 2 that is addressed using a column address CAD2, and a portion of Column 3 that is addressed using a column address CAD3. A particular example is depicted where the system performs a skip evaluation by comparing memory data to user data. The results of the comparison and evaluation are used to determine that for Bay 0 the subset of memory cells from Column 0 (CAD0) cannot be skipped. The system determines that the subset of memory cells corresponding to Column 1 (CAD1) at Bay 0 can be skipped, and that the subset of memory cells corresponding to Column 2 (CAD2) at Bay 0 can be skipped. The system determines that the subset of memory cells corresponding to the Column 3 (CAD3) needs to be programmed and should not be skipped. Similarly the system determines for Bay 1 that Column 0 can be skipped, Column 1 cannot be skipped, Column 2 can be skipped, and that Column 3 can be skipped. For Bay 2, the system determines that Column 0 can be skipped, Column 1 can be skipped, Column 2 can be skipped, and Column 3 cannot be skipped. Finally the system determines that for Bay 4 all of the columns can be skipped.

Where a single column address signal is used to provide one column address to each bay within a bay group, skipping is only permitted for entire columns or column addresses. When each of the subsets of memory cells of the columns in every bay across a bay group matches the user data, programming can be skipped for a column. A single column address is provided to a bay group such that a single column within the bay group can be selected for programming during a column address cycle. Accordingly, the memory data from the memory cells for each subset across all of the bays for a column need to match the user data to be permit a column address cycle to be skipped.

Referring to FIG. 16 and column address CAD0, the subset of memory cells at Bay 0 are the only ones that need to be programmed for the next column address cycle. Nevertheless, traditional approaches still perform an entire column address cycle in order to program a single subset of memory cells at one bay for the column. Similarly, programming for Column 1 would include a full column address cycle to program a single subset of memory cells at one bay for the column, and programming for Column 3 would include a full column address cycle to program two subsets of memory cells at one bay. Column 2 is the only column where the subsets at every bay match user data. Accordingly, only the CAD cycle for CAD2 will be skipped.

In accordance with an embodiment of the disclosed technology, a non-volatile memory system is provided that evaluates whether to skip programming for individual bays within a bay group. The system skips programming for any bay groups for which all of the bays can be skipped. With reference to FIG. 15 for example, the system can analyze Bay Groups 0-3 and perform a skip evaluation by comparing memory data to user data. For example, state machine 131 may determine that Groups 0-1 and 3 should be programmed and Group 2 should be skipped. In response, the state machine programs Groups 0-1 and 3 in three BAD cycles, skipping the BAD cycle for Group 2.

In addition, the system evaluates the bays that can be skipped and cannot skipped within the remaining bay groups. The system regroups the initial bay groups in order to maximize the number of bays programmed within each group, thus potentially reducing the number of BAD cycles required for programming. The system regroups the bays so that programming for each bay group includes a maximum number of parallel programming bays when possible.

In FIG. 14 for example, each default bay group includes four bays that can be programmed simultaneously for each bay group. Accordingly, a maximum number of parallel programming bays is four. Therefore, the system will seek to place four bays that need to be programmed within each bay group, without exceeding the maximum number of parallel programming bays.

FIG. 17 depicts a regrouping that continues with the example of FIG. 15. In FIG. 17, the system determines that Bay Group 0 cannot be skipped. Within Bay Group 0, the system determines that one bay needs to be programmed and three bays can be skipped. Accordingly, the system determines that the first bay address cycle may be regrouped to include three bays from other bay groups in place of Bay Groups 1, 2, and 3. In this manner, the system generates a new group by regrouping the original bay groups.

In FIG. 17 the system places Bay 5 (Group 1), Bay 12 (Group 3), and Bay 14 (Group 3) into Bay Group 0. Thus, Group 0 is regrouped to include four bays that need to be programmed. In this manner, a single BAD cycle can be used to program one group including all the bays to be programmed. The system can regroup the other bay groups to replace Bay 5 in Group 1 with Bay 1 from Group 0, Bay 12 in Group 3 with Bay 2 from Group 0, and Bay 14 in Group 3 with Bay 3 from Group 0. In another example, the replacements in the skipped bays are not performed and the system waits to regroup the bays for a next programming cycle.

FIG. 18 is a table depicting the process and results of skipping and regrouping bay groups according to the example of FIG. 17. FIG. 18 includes four columns corresponding to the four bay group cycles 0-3 that can be used to program the four Bay Groups 0-3. Additionally, three rows are depicted showing the programming for each cycle according to an approach that does not utilize skipping, an approach that utilizes skipping without regrouping, and an approach that utilizes skipping a regrouping according to an embodiment of the disclosure. FIG. 18 continues with the skip information shown in FIG. 15.

Along the top of the table are depicted BAD Cycles 0-3. Each cycle corresponds with a bay address group. If no skipping is utilized as shown in the first row, the system performs all of the BAD cycles and programs each of the Bay Group. During BAD cycle 0, Bay Group 0 is programmed. Similarly, BAD Cycle 1 is used to program Bay 5 from Bay Group 1. Without skipping, the system performs BAD Cycle 2 even though no bays are to be programmed during the cycle. Finally, BAD Cycle 3 is performed to program Bays 12 and 14 from Group 3.

The second row shows the programming process if skipping is performed without regrouping. During BAD Cycle 0, Bay Group 0 is programmed. BAD Cycle 0 is performed to program a single bay, Bay 0. Nevertheless, because all four bays are programmed in parallel according to the Bay Group, a BAD cycle is utilized to program one bay. During BAD Cycle 1, Bay Group 1 is programmed. BAD Cycle 2 is skipped because all of the bays in Bay Group 2 can be skipped. During BAD Cycle 3, Bay Group 3 is programmed. Accordingly, skipping without regrouping allows the system to perform programming for four bay groups using three BAD cycles rather than four.

The third row of FIG. 18 depicts the process and results of skipping and regrouping bays according to one embodiment of the present disclosure. As shown in FIG. 17, Bay Group 1 is regrouped to include the bays that cannot be skipped, thus maximizing the number of parallel programming bays during the cycle. Bay Group 1 includes Bay 0 from the original Bay Group, Bay 5 from Group 2 and Bays 12 and 14 from Group 3. During BAD Cycle 0, the system programs Bay Group 0 including Bays 0, 5, 12, and 14. This includes all of the bays that need to be programmed for all of the bay groups. Accordingly, the system utilizes one BAD cycle to for all the required programming. The system skips BAD Cycles 1, 2, and 3.

In one embodiment, the system utilizes individual column addressing during a column address cycle to provide different column addresses to different bays within a bay group. The system may first determine whether an entire column of memory cells or single column address can be skipped. If the column address cannot be skipped, the system determines whether any subsets of the column address corresponding to individual bays may be skipped. The system can determine whether each of the bits or memory cells at each bay for a column can be skipped during the next CAD cycle. The system groups multiple column addresses for programming during a single column address cycle at different bays. In this manner, the system programs subsets of memory cells from different column addresses at different bays during the CAD cycle. By grouping column addresses for programming in a common cycle, the system may reduce the overall number of CAD cycles required for programming a bay group.

FIG. 19 is a table depicting the process and results of using individual column addressing for individual bays of a bay group according to one embodiment. FIG. 19 includes four columns corresponding to four CAD cycles 0-3. Similar to FIG. 18, three rows are depicted to show the programming for each cycle according to various approaches, demonstrating the cycle savings potential in accordance with an embodiment. The rows depict an approach that does not utilize skipping, an approach that utilizes skipping with a common CAD for all bays, and an approach that utilizes skipping and individual column addressing for bays according to an embodiment of the disclosure. FIG. 19 continues with the skip information shown in FIG. 16.

If no skipping is utilized as shown in the first row, four cycles are used to program four columns using four column addresses. The system will utilize one CAD cycle for CAD0, one CAD cycle for CAD1, one cycle for CAD2, and one cycle for CAD3. The system does not utilize skipping so the cycle for CAD2 is performed even though the column for CAD2 does not need to be programmed.

If skipping is utilized as shown in the second row, the system skips programming for the fourth programming cycle. The system determines that the column address CAD2 is skippable at all bays of the bay group. Accordingly, the system programs CAD0 in the first CAD cycle, CAD1 in the second CAD cycle, and CAD3 in the third CAD cycle. The system skips the fourth CAD Cycle.

As shown in FIG. 16, however, only portions of the columns need to be programmed at each bay. In accordance with one embodiment, the system determines whether portions of each unskippable column can be skipped at individual bays. In the example of FIG. 16, the system determines that Column 0 (CAD0) at Bay 0 cannot be skipped. At Bays 1, 2, and 3, however, the system determines that Column 0 can be skipped. The system determines that Column 1 (CAD1) can be skipped at Bays 0, 2, and 3, but cannot be skipped at Bay 1. The system determines that Column 2 (CAD2) can be skipped at all bays. The system determines that Column 3 (CAD3) can be skipped at Bays 1 and 3, but cannot be skipped at Bays 0 and 2.

Based on the portions of the columns that need to be programmed at each bay, the system performs a grouping to maximize the programming during each CAD cycle as shown in the third row of FIG. 20. Beginning with the first CAD cycle, the system determines the number of bays for which programming can be skipped during the corresponding CAD cycle. The system determines that programming for Column 0 at Bays 1-3 can be skipped. The system then determines if there are other column addresses that need to be programmed for Bays 1-3. The system determines that CAD1 needs to be programmed for Bay1, and that CAD 3 needs to be programmed for Bay 0. Accordingly, the system groups CAD 1 with the first CAD cycle so that column address CAD1 will be applied to Bay 1 during the first CAD cycle. The system also groups CAD3 with the first CAD cycle so that column address CAD3 will be applied to Bay 2 during the first CAD cycle. Because CAD0 is selected for Bay 0 during the first CAD cycle, the system determines that CAD3 cannot be programmed at Bay 0 during the first CAD cycle.

The system determines that CAD3 needs to be programmed at Bay 0 during another CAD cycle. Accordingly, the system groups CAD3 into the second programming cycle. No other column addresses need to be programmed for other bays so the system determines that no additional CAD cycles are needed. As FIG. 19 illustrates, a total of two CAD cycles can be used to program the columns that span four column addresses and four standard CAD cycles.

FIGS. 20A and 20B depict a column and bay architecture in accordance with an embodiment of the disclosure where individual column addressing is provided for bays of a bay group. As shown in FIGS. 20A and 20B, the state machine can select individual columns at each bay for programming in one column address cycle. FIGS. 20A and 20B depict Bay 0, Bay 1, Bay 2 and Bay 3 using the example of FIG. 19 during the first and second CAD cycles.

As shown in FIG. 20A, each bay is provided with an individual CAD select line for receiving an individual column address during a CAD cycle. Bay 0 is in communication with CAD select line 602. Bay 1 is in communication with CAD select line 604. Bay 2 is in communication with CAD Select Line 606. Bay 3 is in communication with CAD select line 608. Individual column address signals can be provided on each of the CAD select lines.

FIG. 20A illustrates the first grouping of column addresses for programming during the first column address cycle of FIG. 19. The system groups and program CAD0 at Bay 0, CAD1 at Bay 1, and CAD3 at Bay 2 during the first CAD cycle (for CAD0). The state machine provides column address CAD0 on select line 602, column address CAD1 on select line 604, and column address CAD3 on select line 606. In this manner, the corresponding columns are selected for programming during the first CAD cycle.

FIG. 20B illustrates the second grouping of column addresses for programming during the second column address cycle of FIG. 19. The system groups and program CAD3 at Bay 0, during the second CAD cycle (for CAD1). The state machine provides column address CAD3 on select line 602. In this manner, Column 3 (CAD3) is selected for programming during the second CAD cycle.

Figure 21:
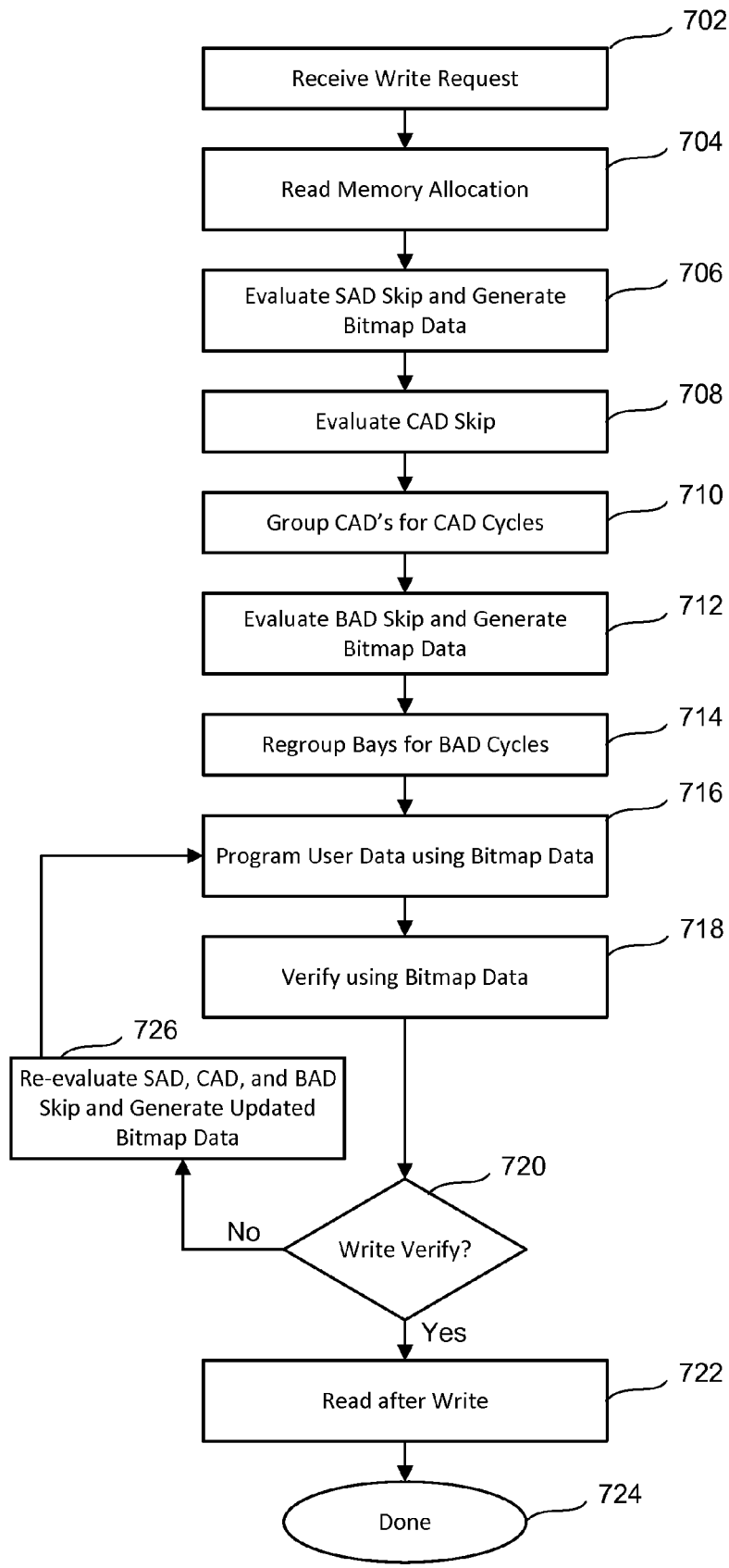
FIG. 21 is a flowchart describing a process for evaluating skip information for programming according to one embodiment.

FIG. 21 is a flowchart in accordance with one embodiment for programming memory cells of a memory array using skip information. At step 702, a request to write data to the memory system is received. In one example, the request includes or is provided with the data to be written. A page of data is received at step 702 in one embodiment although other units of programming or writing can be received. The request and data are received at a state machine 131 in one embodiment. In another example, the request and data are received at controller 132.

At step 704, the memory system initiates a read before write operation prior to beginning the write operation. The system determines the memory allocation in the memory array for satisfying the write request and reads the existing memory data from the allocated memory. As the data is read in step 704, the system dynamically performs a skip evaluation for the write request in steps 706-714.

At step 706, the system evaluates sense amp address (SAD) cycle skipping for the write request. In the particularly shown example, the skip evaluation at step 706 includes generating bitmap data for SAD cycle skipping. At step 706, the state machine can compare each memory data bit read from the memory array with the corresponding user data bit received at step 702. If the two bits match, the state machine generates and stores SAD skip information indicating that the SAD cycle can be skipped. If the two bits do not match, the state machine generates and stores SAD skip information indicating that the SAD cycle should not be skipped. In one example, the skip information is a bitmap for each SAD (corresponding to a SAD cycle). The bitmap can include a logical '1' stored in a data latch for the corresponding SAD. If the two bits do not match, the bitmap can include a logical '0' that is stored in the data latch. Other indications of whether the SAD cycle can be skipped can be used.

At step 708, the system evaluates column address (CAD) cycle skipping for the write request. At step 708 in this example, a bitmap is not directly created and stored for CAD cycle skipping. Instead, the data latches for each SAD cycle within a CAD cycle can be grouped and subjected to a logical NAND operation to determine the CAD skip information. If every SAD data latch for a column indicates that the SAD cycle can be skipped, the CAD skip evaluation indicates that the CAD cycle can be skipped. If every SAD data latch does not indicate that the SAD cycle can be skipped, the CAD skip evaluation indicates that the CAD cycle cannot be skipped. In other examples, step 708 can include generating bitmap information for the CAD cycle skipping.

At step 710, the system performs grouping of column addresses for the CAD cycles that cannot be skipped. For each CAD cycle that cannot be skipped, the system determines the number of bays corresponding to the column address that can be skipped. For example, the system can determine if each bit or memory cell at each bay for the column can be skipped. If each bit can be skipped, the system determines that the portion of the column at that bay can be skipped. For each bay that can be skipped during the CAD cycle, the system determines a CAD address for another column having a subset of memory cells at that bay that need to be programmed. These additional CAD's are grouped together so that the system selects each CAD for programming at the appropriate bay during a common CAD cycle.

At step 712, the state machine generates bitmap data for BAD cycle skipping. In one embodiment, the state machine accesses the CAD skip evaluation (e.g., the result of a logical NAND for the SAD cycles). If the user data for every CAD cycle matches the user data, a data latch for the BAD can store an indication that the BAD cycle for the corresponding bay group can be skipped. If the user data does not match, the data latch for the BAD cycle can store an indication that the BAD cycle should not be skipped.

At step 714, the state machine regroups individual bays that cannot be skipped into new bay groups to reduce the total number of BAD cycles if possible. For example, the system may determine for each bay group that cannot be skipped, whether any individual bays of the group can be skipped. If a bay group contains a bay that can be skipped, the system can replace a skippable bay from the bay group with an unskippable bay from another bay group. The system can repeat this process by replacing skippable bays with unskippable bays from other groups until the maximum number of bays that can be programmed in parallel is reached for the bay group. The system can then repeat this overall process for the remaining bay groups having an unskippable bay. In this manner, the system maximizes the number of bays programmed in parallel for each bay group in an effort to reduce the overall number of BAD cycles that are required.

Although steps 706-714 are shown sequentially and in a particular order, they may be performed in various orders and non-sequentially. For example, steps 706-714 can be performed simultaneously to evaluate the skip information and generate the SAD, BAD and CAD bitmap data as the data is read in step 704.

After evaluating skip information and generating bitmap data, the state machine executes a write operation. The user data is programmed to the memory array at step 716. Step 716 may include set or reset operations as earlier described. At step 716, the memory system cycles through the bay addresses, column addresses and sense amp addresses using the skip information. Step 716 includes writing the user data to the memory array using the bitmap data generated at steps 716-714. Each BAD cycle indicated to be skippable by the bitmap data is skipped. If a BAD cycle cannot be skipped, any CAD cycle within the BAD cycle indicated to be skippable by the bitmap data is skipped. If a CAD cycle cannot be skipped, any SAD within the CAD cycle indicated to be skippable by the bitmap data is skipped.

At step 718, a verify after write operation begins by verifying whether the data programmed at step 716 matches the user data received at step 702. In FIG. 21, only the data written at step 716 is verified. The state machine can use the bitmap data to determine which data to verify. Recognizing that the data determined to be skippable does not need to be verified, the verify operation is accelerated to examine only those memory cells that were actually programmed at step 716. Thus, the state machine skips the verify operation for any BAD cycles, CAD cycles or SAD cycles indicated to be skippable by the bitmap data.

At step 720, the state machine determines whether the write operation was successful based on the verification at step 718. Step 720 can include determining whether all, or a predetermined number of the targeted bits were successfully programmed. If the write operation is verified at step 720, a read after write operation is performed at step 722 to read back all of the data from the memory allocation targeted for the user data. At step 724, the request to write information is completed.

If the write operation is not verified at step 720, the state machine re-evaluates SAD, CAD and BAD cycle skipping and generates updated bitmap data for the SAD skip evaluation and BAD skip evaluation at step 726. In one embodiment step 726 is performed dynamically as the data is read and verified from the memory array at step 718. Step 726 enables the state machine to generate bitmap data that will enable additional cycle skipping as additional memory cells are successfully programmed with the user data. Step 726 includes grouping column addresses for programming different columns across a bay group as performed at step 710. Step 726 also includes regrouping bays into bay groups. An additional set or reset write operation is performed at step 716 to write the unsuccessfully verified bits and the process continues.

Figure 22:
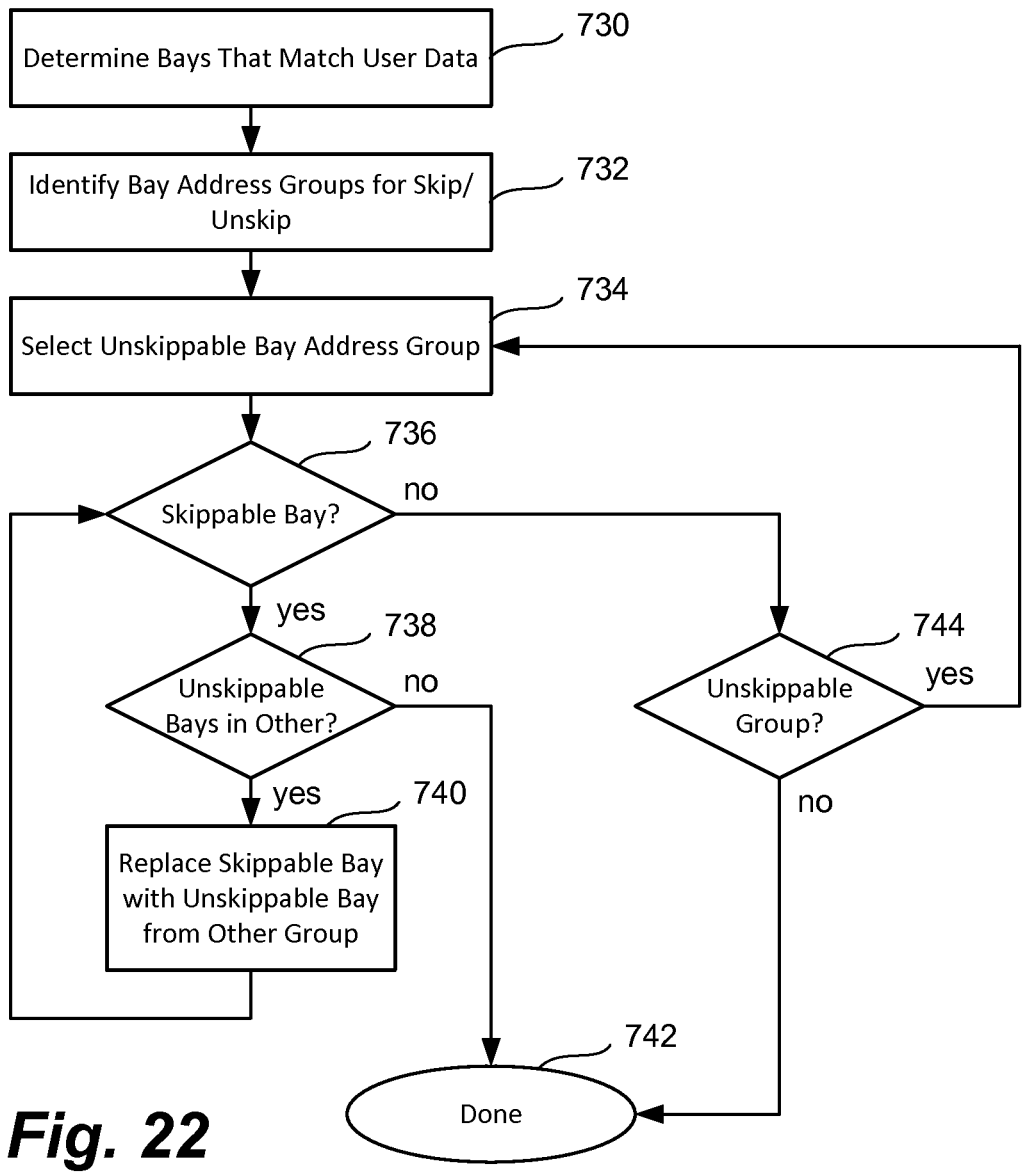
FIG. 22 is a flowchart describing a process of evaluating bay skipping and regrouping bays according to one embodiment.

FIG. 22 is a flowchart describing a process in accordance with one embodiment for evaluating bay skipping that includes regrouping of bays. In one example, the process in FIG. 22 can be used at step 712 and 714 of FIG. 21. It is noted, however, that other processes may be used to evaluate bay skip information and to regroup bays for bay address cycles. At step 730 the state machine determines the bays for a write operation that contain memory data matching the user data. In one example, the state machine analyzes the results of the SAD skip information to determine whether a bay has all of its memory cells containing memory data that matches the user data to be programmed. In one embodiment, step 730 can include generating bitmap data that identifies the bays that match user data. At step 732, the state machine identifies bay groups that can be skipped. In one example the state machine can determine for each bay group whether all of the bays of the group can be skipped. If so, the state machine determines that the bay address group can be skipped. In one example, step 732 includes generating bit map data to identify the bay address groups that can be skipped.

After identifying the bay address groups that can be skipped at step 732, the state machine identifies the bay address groups that cannot be skipped (unskippable) at step 734. It is noted that steps 730-734 can be performed in any order. Moreover the operations performed within the individual steps identified may be combined into one or more operations.

At step 734, the state machine selects a first unskippable bay address group as determined in step 732. For the first unskippable bay address group, the state machine determines at step 736 whether the group contains any skippable bays.

If the state machine determines that there is at least one skippable bay within the unskippable bay address group at step 736, the state machine determines at step 738 whether there are available unskippable bays in other bay groups. That is, the state machine determines whether other unskippable bay groups contain an unskippable bay. In one embodiment, step 738 only examines other bay groups that have at least one skippable bay. In this manner, the state machine will not regroup bay groups having all bays that need to be programmed. In another example, however, the state machine may reorganize or regroup bay address groups containing all unskippable bays, for example, to move these unskippable bays into earlier bay address cycles.

If there are no unskippable bays in any other bay address groups as determined at step 738, the process of evaluating and regrouping the bay groups ends at step 742. If the state machine determines that there are unskippable bays in other address groups at step 738, the state machine proceeds to step 740. At step 740, the state machine replaces the skippable bay from the unskippable bay address group with an unskippable bay from another unskippable bay address group. After replacing the skippable bay with an unskippable bay, the state machine returns to step 736 to determine if there are additional skippable bays within the bay address group. If there are, the process repeats at step 738. If there are no additional skippable bays in the unskippable bay address group, the state machine proceeds to step 744 to determine if there are other unskippable bay address groups to analyze. If there are no unskippable groups remaining, the evaluation and regrouping process ends at step 742.

FIG. 22 demonstrates regrouping default bay address groups to maximize the number of bays programmed for each bay address group. In this manner, the state machine combines multiple bays into a single bay group after analyzing skip information to maximize programming efficiency. Accordingly, the number of required bay address cycles may be reduced as the number of bay address groups being programmed is reduced.

Figure 23:
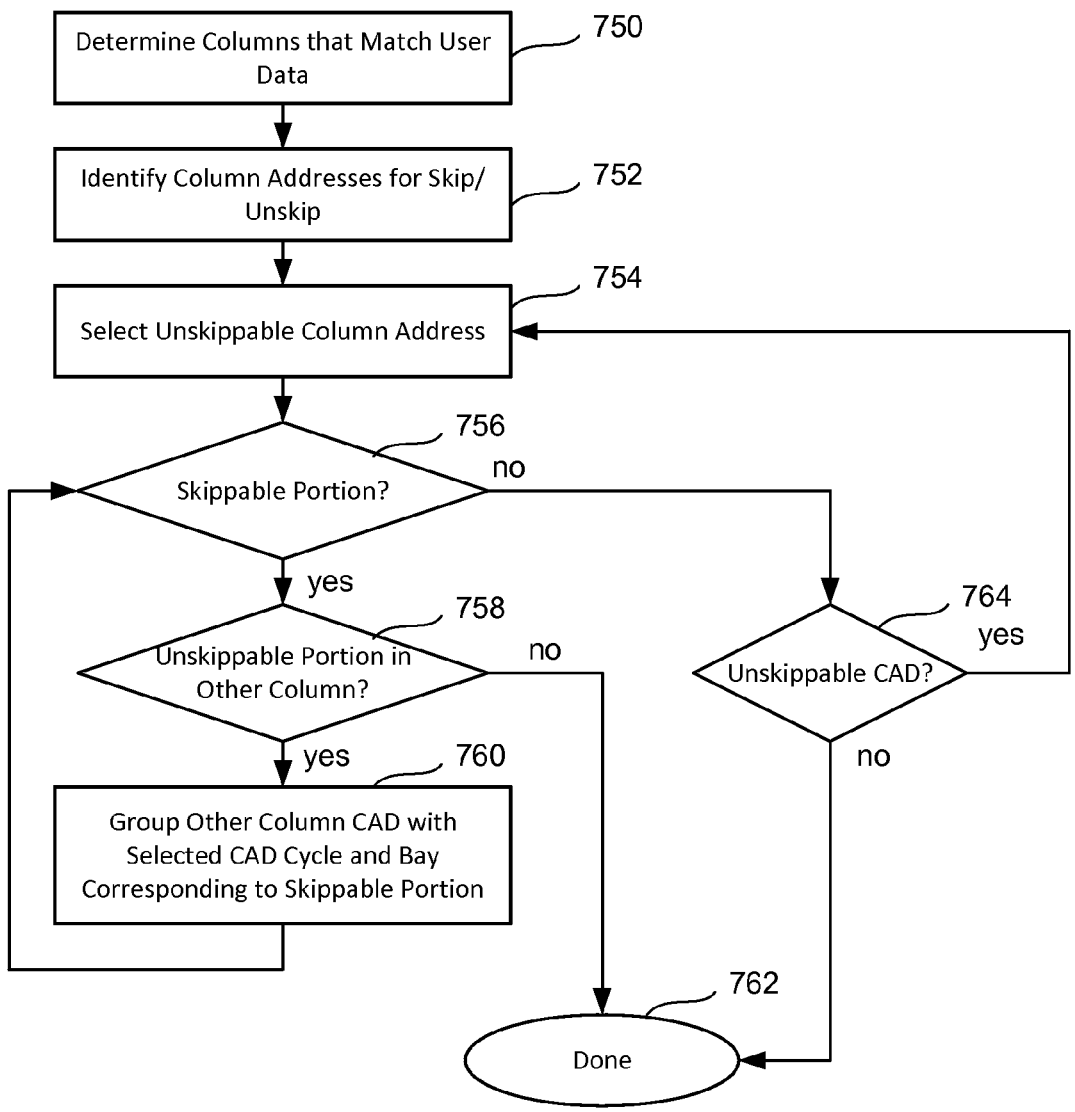
FIG. 23 is a flowchart describing a process of using individual column addressing to select multiple column addresses for programming during a column address cycle.

FIG. 23 is a flowchart describing a process of grouping columns or column addresses for programming portions of different columns at different bays during a single column address cycle. In one example, the process of FIG. 23 can be used to perform steps 708 and 710 of FIG. 21 for an evaluation of column address skipping and grouping of column addresses for programming in a common column address cycle.

At step 750, the state machine determines for each column whether the memory data at the column matches the user data to be programmed for the column. The state machine can utilize the SAD skip information to determine whether all of the bits or memory cells for a particular column across all bays contain memory data that matches the user data. Based on the columns that match user data at step 750, the state machine identifies column addresses that can be skipped and that cannot be skipped at step 752. In one example the state machine generates bit map information identifying the columns that can be skipped and that cannot be skipped. In another example, however, the state machine can apply logic based on the bit map information for the sense amplifier address cycles.

At step 754, the state machine selects a first unskippable column address. At step 756, the state machine determines whether programming for individual portions of the column at the different bays of the group can be skipped. In one embodiment, the state machine determines whether the individual portions of the column corresponding to the column address are skippable at each bay. As earlier described, each column spans a number of bays, for example across all of the bays in a bay group. The state machine can determine at step 756 whether the subsets of memory cells of the column at each bay are skippable.

If the state machine determines that a portion of the column at a bay is skippable, the state machine proceeds to step 758. At step 758, the state machine determines whether there is an unskippable portion of another column remaining in the memory to be programmed. As with the bay groupings, the state machine may in one embodiment of step 758, only select unskippable portions from another column that contains at least one skippable portion for another bay. In this manner the state machine will not partition programming for a particular column for which all portions at all bays need to be programmed. In another example, the state machine may group column addresses without regard to whether the entire column can be skipped.

If the state machine determines that there is another column having an unskippable portion, the state machine proceeds to step 760. At step 760, the state machine groups the CADs for the other column having an unskippable portion with the selected column address cycle from step 754. The state machine also identifies the bay corresponding to this skippable portion. In this manner, the state machine can provide the column address from the other column to the bay corresponding to the skippable portion at step 756 when programming the corresponding column address cycle.

It is noted that for step 758 in one embodiment, the state machine does not combine two column addresses into one column address cycle for programming the same bay. For example, the system may provide one column address to each bay during a column address cycle. Accordingly, the system will replace the column address for a skippable portion at a first bay with a column address for an unskippable portion at the first bay.

If the unskippable CAD from step 754 does not contain a skippable portion, the state machine determines whether there is another unskippable column address remaining. If there is, the state machine proceeds to step 754 to select the next unskippable CAD. If no unskippable column addresses remain, the process is complete at step 762. If the system determines at step 758 that there are no additional columns having an unskippable portion, the process also completes at step 762.

Figure 24:
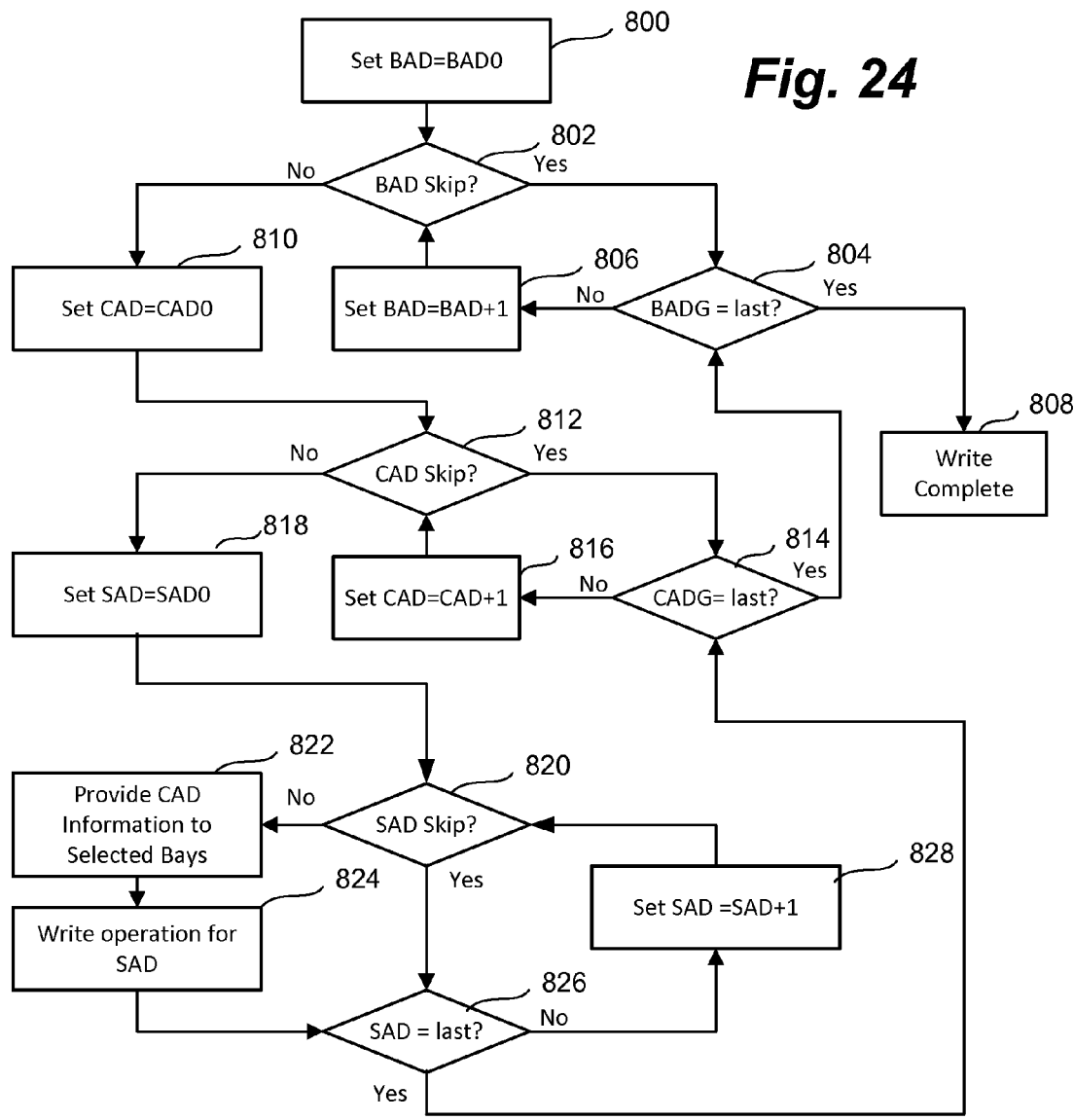
FIG. 24 is a flowchart describing a process of programming using bay regrouping and individual column addressing according to one embodiment.

FIG. 24 is a flowchart describing a method of programming user data using skip information in accordance with one embodiment. FIG. 24 can be performed at step 716 of FIG. 21 in one example. At step 800, the state machine sets the BAD cycle to BAD0. At step 802, the state machine accesses the data latch from register 135 for the bitmap data of BAD cycle BAD0. The state machine determines whether to program the BAD cycle based on the bitmap data. If the bitmap data indicates that cycle BAD0 should be skipped, the state machine does not program data for the BAD cycle. The state machine may skip programming for a BAD cycle by not transferring any data for the BAD cycle from the page register to the sense amps for the memory array in one embodiment. The BAD cycle in this example may correspond with a BAD used to address a bay address group including more than bay.

After skipping programming for the BAD cycle, the state machine determines at step 804 whether the current BAD cycle is the last BAD cycle. If the current BAD cycle is not the last, the BAD cycle is incremented by one at step 806. At step 802, the state machine checks whether the new BAD cycle can be skipped. If the BAD cycle is the last, the state machine completes the write operation at step 808.

If the skip information indicates that BAD cycle BAD0 should not be skipped, the state machine sets the CAD cycle to the first column address CAD0 at step 810. It is noted in this example that the CAD is used to select a column that spans multiple bays. At step 812, the state machine accesses the data latch storing the bit map data for the CAD cycle corresponding to CAD0. If the bit map data indicates that CAD0 should be skipped, the state machine does not write data for the CAD cycle to the memory array. In one example of step 812 the state machine may skip transferring data from the page register to the memory array. The state machine may skip selection of columns within the CAD cycle for transfer on each of the data buses PR_OUT [15:]. At step 812, the state machine may skip the transfer of data from page register 133 to the sense amps for programming for the CAD cycle. Step 812 can include skipping the transfer of data for multiple columns to the sense amplifiers for programming.

At step 814, the state machine determines whether the current CAD cycle is the last for the current BAD cycle. If the CAD cycle is not the last, the state machine increments the CAD cycle by one at step 816 and returns to step 812 to determine whether the next CAD cycle can be skipped.

If the skip information indicates that CAD cycle CAD0 should not be skipped, the state machine sets the SAD cycle to SAD0 at step 818. At step 820, the state machine accesses the data latch with the bit map data for SAD cycle SAD0 to determine the skip information. If the skip information indicates that SAD cycle SAD0 should be skipped, the state machine skips programming for SAD cycle SAD0 at step 820. In one example, the data for one CAD cycle is transferred to the sense amplifiers for programming at a time. If an entire CAD cycle cannot be skipped, the state machine can transfer data for the CAD cycle to sense amps in one example. Accordingly, in one embodiment step 820 includes skipping the programming of data transferred to sense amps, for example through a sense amp enable signal. In another example, step 820 can include skipping the transfer of data from page register 133 to the sense amplifiers.

If the skip information indicates that SAD cycle SAD0 should not be skipped, the state machine provides the CAD information for the sense amp address cycle to the selected bays at step 822. At step 822, the state machine provides individual column addresses to the individual bays of the bay group. The state machine can provide separate column addresses to create a column address grouping for the column address cycle. The column address grouping includes the column addresses for the different columns. Although shown as being performed after the SAD Skip determination at step 820, step 822 can be performed at different times, for example as part of the CAD Skip determination at step 812 or setting the SAD cycle at step 818.

The state machine performs the write operation for SAD0 at step 824. The state machine determines whether the SAD cycle is the last cycle for the current CAD cycle at step 826. If the SAD cycle is not the last for the CAD cycle, the state machine increments the SAD cycle by one at step 828. The state machine then determines whether the current SAD cycle can be skipped at step at step 820.

If the SAD cycle is the last, the state machine determines whether the current CAD cycle is the last at step 814. If the current CAD cycle is not the last, the CAD cycle is incremented at step 814 as described above. If the current CAD cycle is the last, the state machine determines whether the current BAD cycle is the last at step 804. If the current BAD cycle is not the last, the BAD cycle is incremented by one at step 806 as described above. If the BAD cycle is the last, the state machine completes the write operation at step 808.

Accordingly, a non-volatile memory system including an array of non-volatile storage elements arranged into a set of columns and a set of bays is provided. Each column includes a plurality of subsets of non-volatile storage elements. Each subset of non-volatile storage elements from each column is associated with one bay from the set of bays. The memory system includes one or more control circuits in communication with the non-volatile memory array. The one or more control circuits are configured to determine for a write request whether programming can be skipped for each subset of non-volatile storage elements from a first column of non-volatile storage elements and a second column of non-volatile storage elements based on comparing the write request to memory data from the first column of non-volatile storage elements and the second column of non-volatile storage elements. The one or more control circuits are configured to group into a first column address cycle a first subset of non-volatile storage elements from the first column that cannot be skipped with a second subset of non-volatile storage elements from the second column that cannot be skipped.

A method of programming non-volatile storage is provided in one embodiment that includes providing a first column address to a first bay of non-volatile storage elements and providing a second column address to a second bay of non-volatile storage elements. The first column address is associated with a first column that includes non-volatile storage elements in the first bay and the second bay. The method includes, while providing the first column address to the first bay, providing a second column address to the second bay of non-volatile storage elements. The second column address is associated with a second column that includes non-volatile storage elements in the first bay and the second bay. The method includes, in response to the first column address and the second column address, simultaneously programming in a first column address cycle a first portion of the first column of non-volatile storage elements in the first bay and a second portion of the second column of non-volatile storage elements in the second bay.

A method of programming non-volatile storage is provided in one embodiment that includes identifying a set of columns for writing user data in response to a write request. Each column is associated with a plurality of bays. The method includes comparing the user data to memory data from a set of non-volatile storage elements associated with the set of columns, determining whether programming can be skipped for each of the columns based on comparing the user data, and for each column for which programming cannot be skipped, determining whether a portion of the column at each bay can be skipped. The method includes grouping in a single column address cycle a plurality of column addresses for columns that cannot be skipped. The plurality of column addresses includes a first column address for a first column at a first bay and a second column address for a second column at a second bay.

A non-volatile memory system according to one embodiment includes a non-volatile memory array that includes a plurality of non-volatile storage elements arranged into a set of columns and a set of bays. Each column includes a plurality of subsets of non-volatile storage elements, and each subset of non-volatile storage elements from each column is associated with one bay from the set of bays. The memory system includes a set of data latches configured to store bitmap data that identifies skip information for each subset of non-volatile storage elements for each column. The memory system includes one or more control circuits in communication with the non-volatile memory array. The one or more control circuits are configured to program a first set of non-volatile storage elements associated with a first column address during a first column address cycle. The first set of non-volatile storage elements is part of a first column of non-volatile storage elements and is located in a first bay. The one or more control circuits are configured to program a second set of non-volatile storage elements associated with a second column address during the first column address cycle. The second set of non-volatile storage elements is part of a second column of non-volatile storage elements and is located in a second bay.

A method of programming non-volatile storage is provided in one embodiment that includes identifying a set of bays for writing user data. The set of bays is part of a non-volatile memory array including a plurality of non-volatile storage elements arranged into a plurality of columns and the set of bays Each column includes a plurality of subsets of non-volatile storage elements and each subset of non-volatile storage elements is associated with one bay from the set of bays. The method includes determining whether programming can be skipped for each of the bays based on comparing the user data to memory data from each bay, determining that programming cannot be skipped for a subset of the set of bays, and generating a plurality of bay groups for programming the subset of bays based on comparing a number of the subset of bays with a parallel bay programming number. A first bay group includes a first bay and a second bay for programming during a common bay address cycle in response to determining that programming cannot be skipped. The method includes programming the first bay and the second bay in the common bay address cycle.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope of the invention be defined by the claims appended hereto.

What is claimed is:

1. A method of programming non-volatile storage, comprising:
   providing a first column address to a first bay of non-volatile storage elements for a first column address cycle, wherein the first column address is associated with a first column that includes non-volatile storage elements in the first bay and a second bay of non-volatile storage elements;
   providing a second column address to the second bay of non-volatile storage elements for the first column address cycle and a second column address cycle, wherein the second column address is associated with a second column that includes non-volatile storage elements in the first bay and the second bay; and
   in response to the first column address and the second column address, simultaneously programming in the first column address cycle a first portion of the first column of non-volatile storage elements in the first bay and a second portion of the second column of non-volatile storage elements in the second bay, wherein programming in the first column address cycle includes skipping programming for a second portion of the first column in the second bay; and programming in the second column address cycle a first portion of the second column in the first bay.

2. The method of claim 1, wherein:
simultaneously programming includes skipping programming for the first portion of the second column of non-volatile storage elements in the first bay.

3. The method of claim 1, further comprising:
identifying the first column and the second column for writing data in response to a write request;
comparing the user data to memory data from the first column of non-volatile storage elements and the second column of non-volatile storage elements;
based on the comparing, determining that programming cannot be skipped for the first column of non-volatile storage elements or the second column of non-volatile storage elements;
based on the comparing, determining that programming for the first portion of the first column cannot be skipped and that programming for the second portion of the second column cannot be skipped; and
generating bitmap data to group the first column address and the second column address into the first column address cycle.

4. The method of claim 3, wherein:
providing the first column address to the first bay and providing the second column address to the second bay are performed simultaneously for the first column address cycle in response to the bitmap data.

5. The method of claim 1, wherein:
the first bay of non-volatile storage elements and the second bay of non-volatile storage elements are part of a monolithic three-dimensional non-volatile memory array.

6. The method of claim 1, wherein:
the first bay and the second bay are part of a bay group; and
the first column and the second column span the bay group.

7. The method of claim 6, wherein the first column address cycle and the second column address cycle are performed for a first write request, the method further comprising:
determining in response to a second write request that programming for the first column address cannot be skipped for the first bay and the second bay; and
providing the first column address to the bay group to simultaneously program the first column across the first bay and the second bay in response to the second write request.

8. A non-volatile memory system, comprising:
a non-volatile memory array including a plurality of non-volatile storage elements arranged into a set of columns and a set of bays, wherein each column includes a plurality of subsets of non-volatile storage elements, wherein each subset of non-volatile storage elements from each column is associated with one bay from the set of bays; and
one or more control circuits in communication with the non-volatile memory array, the one or more control circuits configured to determine for a write request whether programming can be skipped for each subset of non-volatile storage elements from a first column of non-volatile storage elements and a second column of non-volatile storage elements based on comparing the write request to memory data from the first column of non-volatile storage elements and the second column of non-volatile storage elements, the one or more control circuits configured to group into a first column address cycle a first subset of non-volatile storage elements from the first column at a first bay that cannot be skipped with a second subset of non-volatile storage elements from the second column at a second bay that cannot be skipped; and group into a second column address cycle a first subset of non-volatile storage elements from the second column at the first bay that cannot be skipped.

9. The non-volatile memory system of claim 8, wherein:
the one or more control circuits are configured to program the first subset of non-volatile storage elements from the first column and the second subset of non-volatile storage elements from the second column in the first column address cycle.

10. The non-volatile memory system of claim 9, wherein:
the one or more control circuits are configured to select the first subset of non-volatile storage elements from the first column for programming during the first column address cycle by providing a first column address to a first bay including the first subset; and
the one or more control circuits are configured to select the second subset of non-volatile storage elements from the second column for programming during the first column address cycle by providing a second column address to a second bay including the second subset.

11. The non-volatile memory system of claim 10, wherein:
the one or more control circuits are configured to group the first subset of non-volatile storage elements and the second subset of non-volatile storage elements by providing the first column address to the first bay for the first column address cycle and providing the second column address to the second bay for the first column address cycle.

12. The non-volatile memory system of claim 11, wherein:
the one or more control circuits are configured to skip programming for a second subset of non-volatile storage elements from the first column during the first column address cycle based on comparing the write request to the memory data from the first column, wherein the second subset of non-volatile storage elements is part of the second bay.

13. A method of programming non-volatile storage, comprising:
identifying a set of columns for writing user data in response to a write request, wherein each column is associated with a plurality of bays;
comparing the user data to memory data from a set of non-volatile storage elements associated with the set of columns;
determining whether programming can be skipped for each of the columns based on comparing the user data;
for each column for which programming cannot be skipped, determining whether a portion of the column at each bay can be skipped; and
grouping in a first column address cycle a first column address to program a first portion of a first column at a first bay and a second column address to program a second portion of a second column at a second bay;

providing in a second column address cycle the second column address to program a first portion of the second column at the first bay.

14. The method of claim 13, wherein grouping in the first column address cycle comprises:
   providing the first column address to the first bay and the second column address to the second bay for the first column address cycle; and
   simultaneously programming a first subset of non-volatile storage elements from the first column and a second subset of non-volatile storage elements from the second column during the single column address cycle.

15. The method of claim 13, wherein the write request is a first write request, the method further comprising:
   determining that programming cannot be skipped for the first column or the second column in response to a second write request;
   providing the first column address to the first bay and the second bay during a first column address cycle associated with the second write request; and
   providing the second column address to the first bay and the second bay during a second column address cycle associated with the second write request.

16. A non-volatile memory system, comprising:
   a non-volatile memory array including a plurality of non-volatile storage elements arranged into a set of columns and a set of bays, wherein each column includes a plurality of subsets of non-volatile storage elements, wherein each subset of non-volatile storage elements from each column is associated with one bay from the set of bays;
   a set of data latches configured to store bitmap data that identifies skip information for each subset of non-volatile storage elements for each column; and
   one or more control circuits in communication with the non-volatile memory array, the one or more control circuits configured to program a first set of non-volatile storage elements associated with a first column address during a first column address cycle, wherein the first set of non-volatile storage elements is part of a first column of non-volatile storage elements and is located in a first bay, the one or more control circuits configured to program a second set of non-volatile storage elements associated with a second column address during the first column address cycle, wherein the second set of non-volatile storage elements is part of a second column of non-volatile storage elements and is located in a second bay, the one or more control circuits configured to program a first set of non-volatile storage elements associated with the second column address during a second column address cycle, wherein the first set of non-volatile storage elements associated with the second column address is part of the second column and is located in the first bay.

17. The non-volatile memory system of claim 16, wherein:
   each column is associated with a column address; and
   the skip information identifies for each column address whether programming for the column address can be skipped individually for each bay.

18. The non-volatile memory system of claim 16, wherein:
   the set of non-volatile storage elements includes a set of memory cells including a reversible resistance-switching material; and
   the non-volatile memory array is a monolithic three-dimensional non-volatile memory array.

* * * * *